(12) United States Patent
Sypolt et al.

(10) Patent No.: US 10,522,925 B2
(45) Date of Patent: Dec. 31, 2019

(54) CIRCUIT CARD ASSEMBLIES FOR A COMMUNICATION SYSTEM

(71) Applicant: TE CONNECTIVITY CORPORATION, Berwyn, PA (US)

(72) Inventors: Matthew Jeffrey Sypolt, Harrisburg, PA (US); Chad William Morgan, Carneys Point, NJ (US); John Joseph Consoli, Harrisburg, PA (US); Margaret Mahoney Fernandes, West Chester, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/945,767

(22) Filed: Apr. 5, 2018

(65) Prior Publication Data
US 2019/0103691 A1    Apr. 4, 2019

Related U.S. Application Data

(60) Provisional application No. 62/565,332, filed on Sep. 29, 2017.

(51) Int. Cl.
*H01R 13/6585* (2011.01)
*H01R 12/73* (2011.01)
(Continued)

(52) U.S. Cl.
CPC ....... *H01R 12/737* (2013.01); *H01R 12/7064* (2013.01); *H01R 12/82* (2013.01);
(Continued)

(58) Field of Classification Search
CPC ...... H01R 9/096; H01R 12/52; H01R 13/658; H01R 13/6585; H01R 13/6586;
(Continued)

(56) References Cited

U.S. PATENT DOCUMENTS

| 3,587,029 A | 6/1971 | Knowles |
| 4,560,221 A | 12/1985 | Olsson |

(Continued)

FOREIGN PATENT DOCUMENTS

| EP | 2346117 A2 | 7/2011 |
| EP | 2451262 A2 | 5/2012 |

(Continued)

OTHER PUBLICATIONS

Kerridge et al., 'Fast Backplane Connectors Disguise Digital Transmission Lines,' (Texas Instrument), Reed Business Information, Highlands Ranch, Co, US, vol. 42, No. Europe, May 8, 1997, XP000724062.

(Continued)

*Primary Examiner* — Abdullah A Riyami
*Assistant Examiner* — Justin M Kratt

(57) ABSTRACT

A communication system includes a first circuit card assembly having a first PCB and a first electrical connector with first contacts and a second circuit card assembly having a second PCB and a second electrical connector with second contacts. At least one of the PCBs include a slot configured to receive the other PCB when mated in a board mating direction. The first electrical connector is mated to the second electrical connector in a connector mating direction perpendicular to the board mating direction. The first contacts are mated to the second contacts in a contact mating direction as the first PCB and the second PCB are mated in the board mating direction and as the first electrical connector and the second electrical connector are mated in the connector mating direction. The contact mating direction is non-parallel to the board mating axis and non-parallel to the connector mating axis.

20 Claims, 13 Drawing Sheets

(51) Int. Cl.
   *H01R 13/6582* (2011.01)
   *H01R 13/11* (2006.01)
   *H01R 12/70* (2011.01)
   *H05K 1/14* (2006.01)
   *H05K 7/14* (2006.01)
   *H01R 13/631* (2006.01)
   *H01R 12/82* (2011.01)
   *H01R 13/658* (2011.01)
   *H01R 13/6587* (2011.01)
   *H01R 13/6594* (2011.01)
   *H01R 12/52* (2011.01)
   *H01R 13/6586* (2011.01)
   *H01R 24/00* (2011.01)

(52) U.S. Cl.
   CPC ......... *H01R 13/112* (2013.01); *H01R 13/631* (2013.01); *H01R 13/6582* (2013.01); *H01R 13/6585* (2013.01); *H05K 1/14* (2013.01); *H05K 7/1417* (2013.01); *H05K 7/1435* (2013.01); *H05K 7/1444* (2013.01); *H01R 12/52* (2013.01); *H01R 13/113* (2013.01); *H01R 13/658* (2013.01); *H01R 13/6586* (2013.01); *H01R 13/6587* (2013.01); *H01R 13/6594* (2013.01); *H01R 24/005* (2013.01); *H05K 2201/048* (2013.01); *H05K 2201/09063* (2013.01); *H05K 2201/10325* (2013.01); *H05K 2201/10333* (2013.01)

(58) Field of Classification Search
   CPC .............. H01R 23/688; H01R 13/6587; H01R 13/6594; H01R 23/6873; H01R 23/7073
   USPC ........ 439/65, 607.4, 607.23, 607.05, 607.08, 439/607.09, 607.11
   See application file for complete search history.

(56) References Cited

U.S. PATENT DOCUMENTS

| | | | |
|---|---|---|---|
| 5,114,353 A * | 5/1992 | Sample | ................ H01R 23/68 361/791 |
| 5,676,559 A | 10/1997 | Laub et al. | |
| 6,796,822 B2 | 9/2004 | Sato et al. | |
| 6,918,775 B2 | 7/2005 | Korsunsky et al. | |
| 7,086,866 B1 | 8/2006 | Folan et al. | |
| 7,322,834 B2 | 1/2008 | Hu et al. | |
| 7,326,092 B2 | 2/2008 | Fedder et al. | |
| 7,435,095 B1 | 10/2008 | Yi | |
| 7,540,744 B1 | 6/2009 | Minich | |
| 7,708,578 B1 | 5/2010 | Lenox | |
| 7,771,207 B2 | 8/2010 | Hamner et al. | |
| 7,789,668 B1 | 9/2010 | Hamner et al. | |
| 7,824,187 B1 | 11/2010 | Yi | |
| 7,918,683 B1 | 4/2011 | Hamner et al. | |
| 7,988,457 B1 | 8/2011 | Morgan | |
| 8,113,851 B2 | 2/2012 | Hamner et al. | |
| 8,199,511 B2 | 6/2012 | Kim et al. | |
| 8,376,766 B1 | 2/2013 | Huettner et al. | |
| 8,512,081 B2 | 8/2013 | Stokoe | |
| 8,684,610 B2 | 4/2014 | Nichols et al. | |
| 9,551,625 B2 | 1/2017 | Brugger | |
| 9,608,371 B2 | 3/2017 | Bonzom et al. | |
| 9,608,382 B2 | 3/2017 | McClellan et al. | |
| 9,917,406 B1 * | 3/2018 | Iwasaki | ............. H01R 13/6587 |
| 2002/0071259 A1 | 6/2002 | Roos | |
| 2005/0064733 A1 | 3/2005 | Korsunsky et al. | |
| 2005/0070136 A1 | 3/2005 | Korsunsky et al. | |
| 2005/0181637 A1 | 8/2005 | Williams et al. | |
| 2007/0184676 A1 | 8/2007 | Minich | |
| 2008/0045087 A1 | 2/2008 | Yi et al. | |
| 2014/0065849 A1 | 3/2014 | Kida et al. | |
| 2016/0006150 A1 | 1/2016 | Bachmutsky et al. | |
| 2018/0040989 A1 | 2/2018 | Chen | |
| 2018/0261941 A1 | 9/2018 | Consoli et al. | |

FOREIGN PATENT DOCUMENTS

| | | |
|---|---|---|
| JP | 2003044794 A | 2/2003 |
| TW | M537321 U | 2/2017 |
| WO | 2007092113 A2 | 8/2007 |

OTHER PUBLICATIONS

Co-pending U.S. Appl. No. 15/945,821, filed Apr. 5, 2018.
Co-pending U.S. Appl. No. 15/945,802, filed Apr. 5, 2018.
Co-pending U.S. Appl. No. 15/945,787, filed Apr. 5, 2018.
Co-pending U.S. Appl. No. 15/945,775, filed Apr. 5, 2018.
Co-pending U.S. Appl. No. 15/945,812, filed Apr. 5, 2018.

* cited by examiner

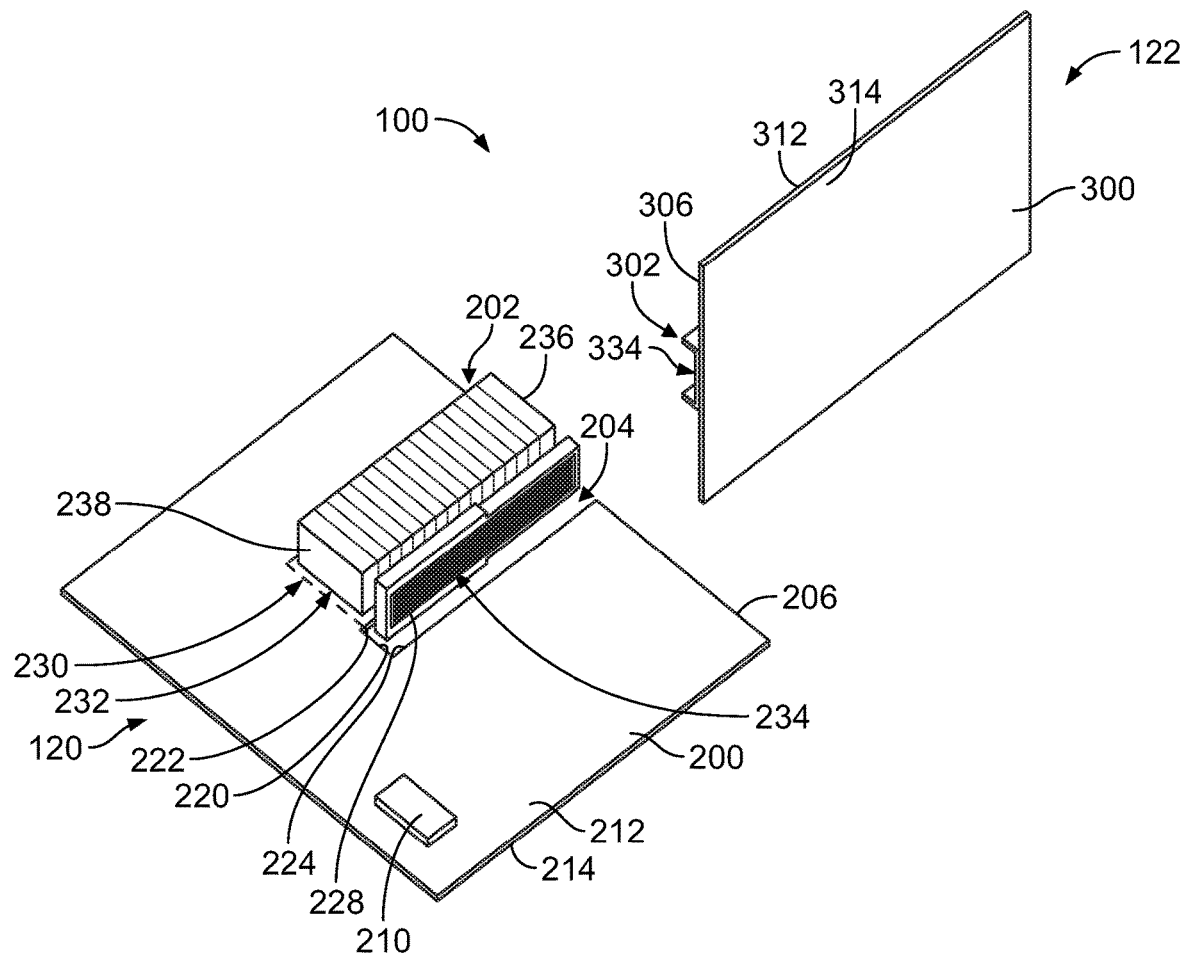
FIG. 5
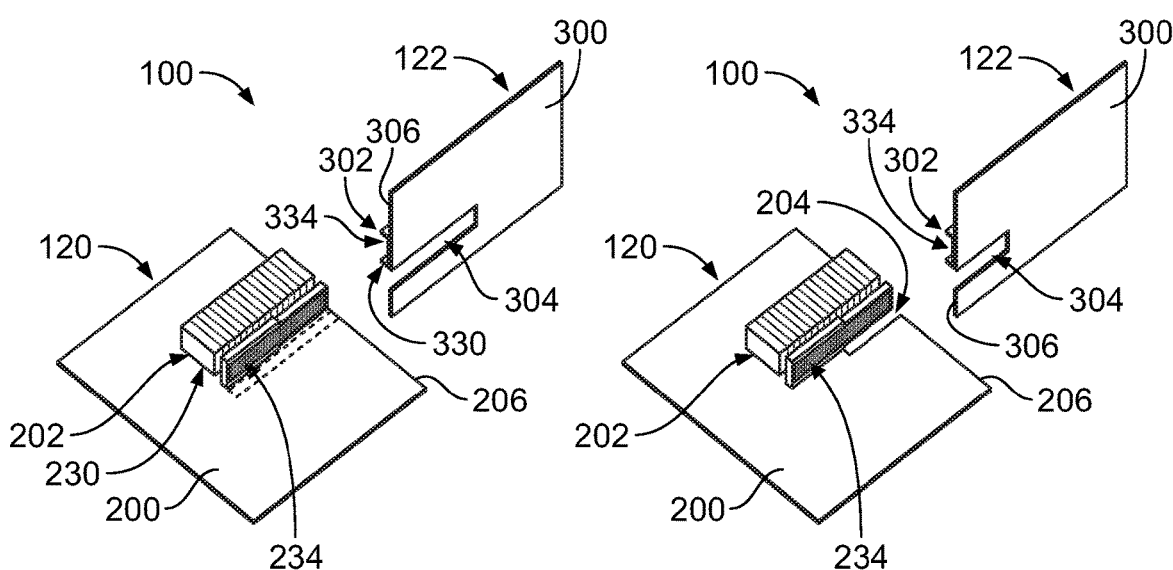
FIG. 6     FIG. 7

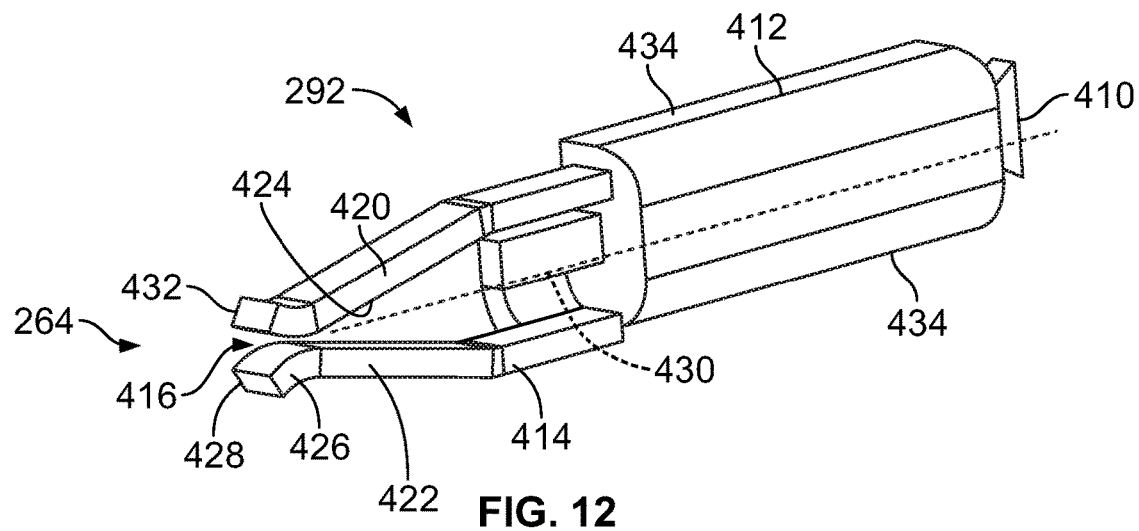
FIG. 12
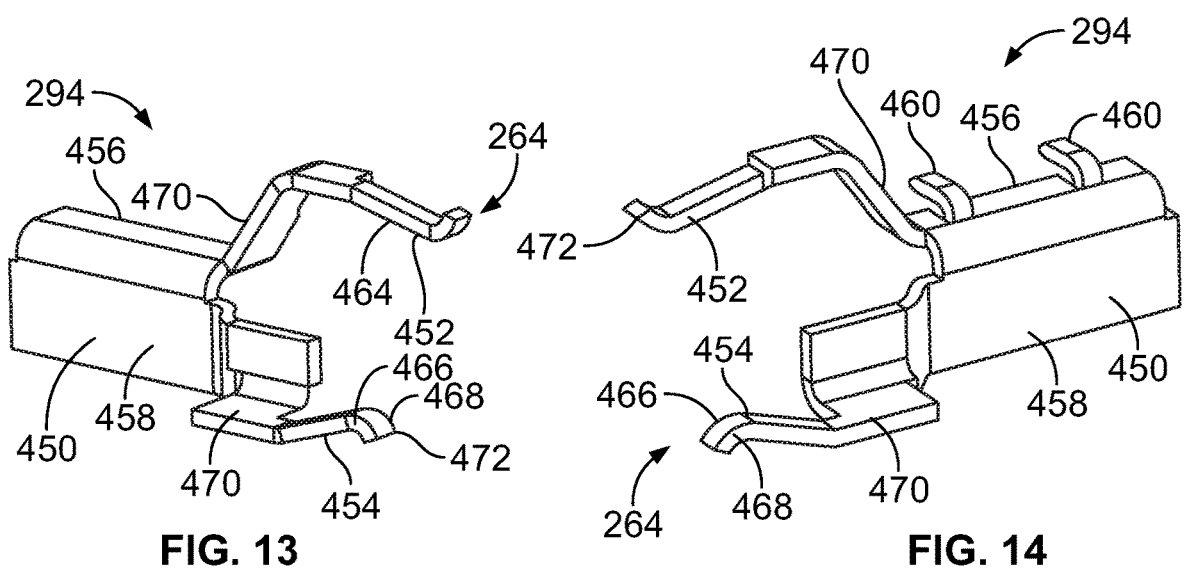
FIG. 13
FIG. 14

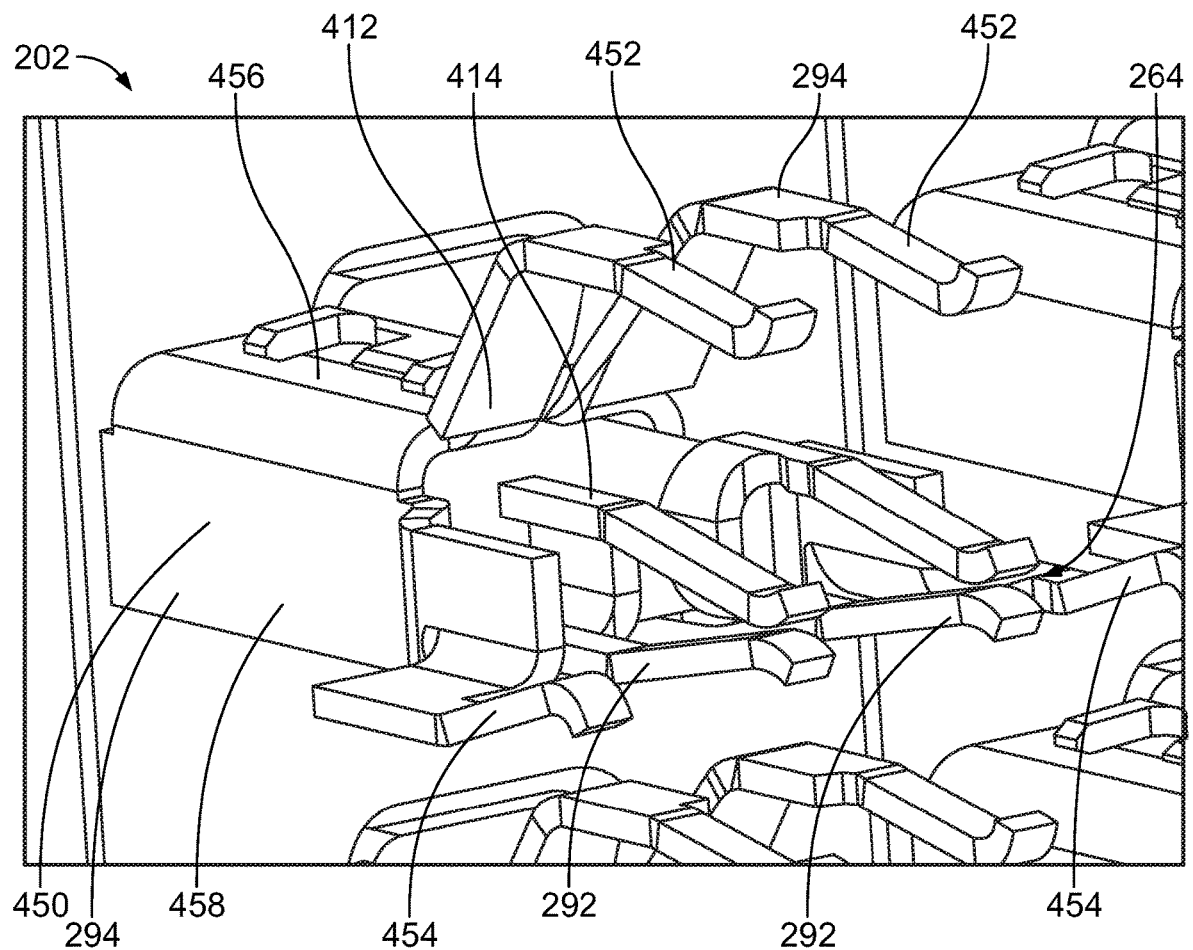
FIG. 15
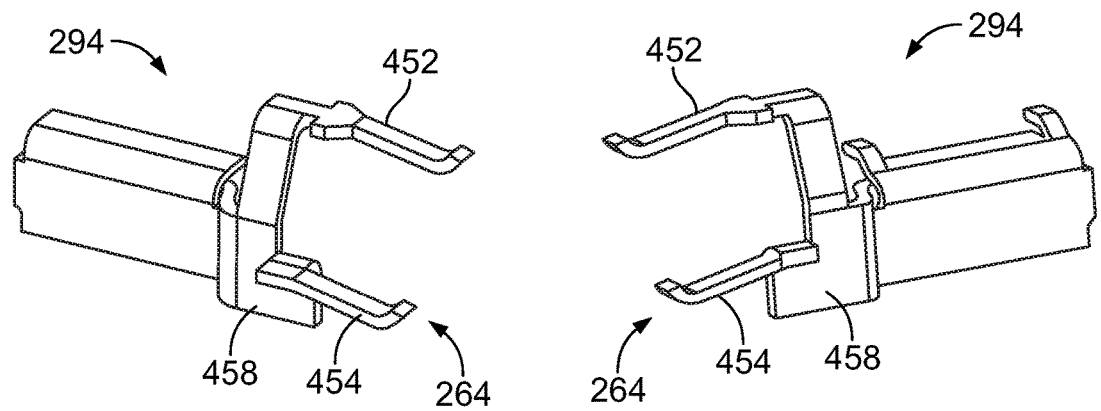
FIG. 16  FIG. 17

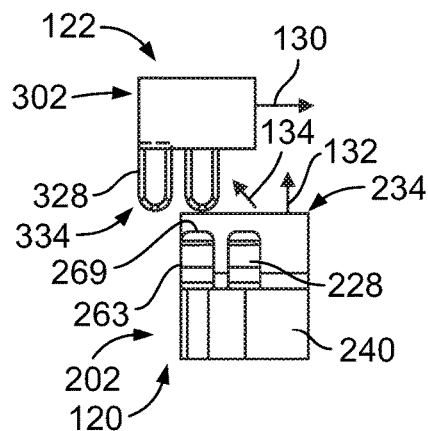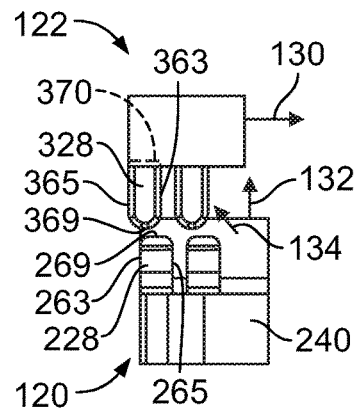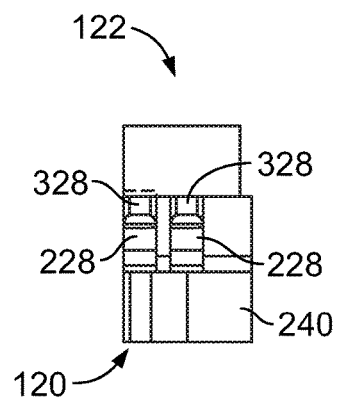
FIG. 30  FIG. 31  FIG. 32
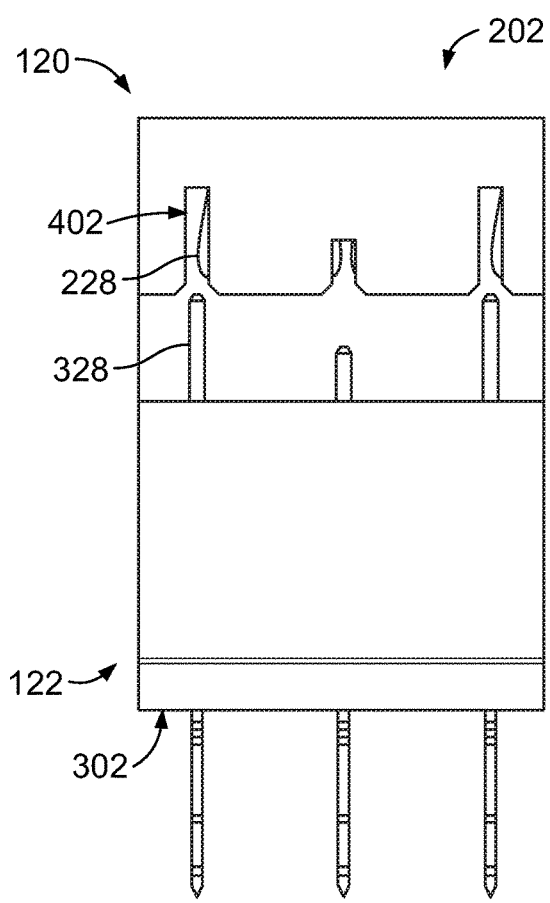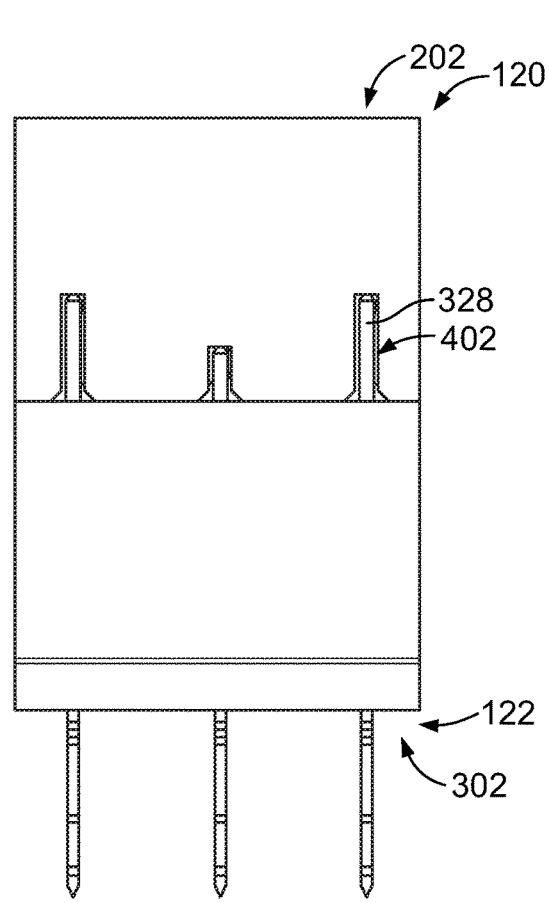
FIG. 33  FIG. 34

CIRCUIT CARD ASSEMBLIES FOR A COMMUNICATION SYSTEM

CROSS REFERENCE TO RELATED APPLICATIONS

This application claims benefit to U.S. Provisional Application No. 62/565,332, filed Sep. 29, 2017, titled "CIRCUIT CARD ASSEMBLIES FOR A COMMUNICATION SYSTEM", the subject matter of which is herein incorporated by reference in its entirety.

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented perpendicular to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right angle electrical connectors are expensive to manufacture and occupy a large amount of space in the system, thus blocking airflow through the system.

A need remains for a cost effective and reliable communication system allowing airflow through the communication system for cooling the electrical components.

BRIEF DESCRIPTION OF THE INVENTION

In one embodiment, a communication system is provided including a first circuit card assembly having a first printed circuit board (PCB) and a first electrical connector having a first mating end and first contacts at the first mating end and a second circuit card assembly having a second PCB and a second electrical connector having a second mating end and second contacts at the second mating end. At least one of the first PCB and the second PCB include a slot configured to receive the other of the first PCB and the second PCB. The first PCB and the second PCB are mated in a board mating direction to bring the first mating end and the second mating end into alignment. The first mating end of the first electrical connector is mated to the second mating end of the second electrical connector in a connector mating direction perpendicular to the board mating direction. The first contacts are mated to the second contacts in a contact mating direction as the first PCB and the second PCB are mated in the board mating direction and as the first electrical connector and the second electrical connector are mated in the connector mating direction. The contact mating direction is non-parallel to the board mating axis and non-parallel to the connector mating axis.

In another embodiment, a circuit card assembly for a communication system is provided including a PCB having a first surface and a second surface extending along a primary axis and a secondary axis. The PCB has a mating edge between the first and second surfaces generally parallel to the secondary axis and a mounting area on the first surface adjacent the mating edge. The circuit card assembly includes an electrical connector mounted to the first surface at the mounting area. The electrical connector has a housing extending between a front and a rear with the front provided proximate to the mating edge. The electrical connector has a mounting end extending between the front and the rear being mounted to the mounting area. The electrical connector has a mating end extending between the front and the rear generally parallel to the primary axis. The mating end is configured to be mated to a mating electrical connector. The electrical connector has signal contacts held by the housing being terminated to the PCB and ground contacts held by the housing being terminated to the PCB. Each signal contact has a mating beam extending along a beam axis and the signal contact is configured to be mated with a mating contact in a contact mating direction non-parallel to the beam axis. Each ground contact has a first wall extending along a first side of the corresponding signal contact and a second wall extending along a second side of the corresponding signal contact to provide electrical shielding on at least two different sides of the corresponding signal contact.

In a further embodiment, a circuit card assembly for a communication system is provided including a PCB having a first surface and a second surface extending along a primary axis and a secondary axis. The PCB has a mating edge between the first and second surfaces generally parallel to the secondary axis and a mounting area on the first surface adjacent the mating edge. The circuit card assembly includes an electrical connector mounted to the first surface at the mounting area. The electrical connector has a housing extending between a front and a rear with the front being provided proximate to the mating edge. The electrical connector has a mounting end extending between the front and the rear being mounted to the mounting area and a mating end extending between the front and the rear generally parallel to the primary axis. The mating end is configured to be mated to a mating electrical connector in a connector mating direction generally parallel to the secondary axis. The electrical connector has signal contacts held by the housing and ground contacts held by the housing to provide electrical shielding on at least two different sides of the corresponding signal contacts. Each signal contact has a base conductor, a dielectric shroud around the base conductor and a mating beam extending from the base conductor out of the dielectric shroud for mating with a mating contact in a contact mating direction non-parallel to a beam axis of the mating beam. Each ground contact has a first wall seated against the corresponding dielectric shroud and extending along a first side of the corresponding signal contact and a second wall seated against the corresponding dielectric shroud and extending along a second side of the corresponding signal contact. Each ground contact has a first mating beam aligned with the mating beam of the corresponding signal contact and extending along the first side of the corresponding signal contact. Each ground contact has a second mating beam aligned with the mating beam of the corresponding signal contact and extending along the second side of the corresponding signal contact.

BRIEF DESCRIPTION OF THE DRAWINGS

FIG. 5 is a perspective view of a portion of the communication system showing the first circuit card assembly and the second circuit card assembly poised for mating.

FIG. 6 is a perspective view of a portion of the communication system in accordance with an exemplary embodiment.

FIG. 7 is a perspective view of a portion of the communication system in accordance with an exemplary embodiment.

FIG. 12 is a perspective view of a portion of a signal contact formed in accordance with an exemplary embodiment.

FIG. 13 is a perspective view of a ground contact 294 in accordance with an exemplary embodiment.

FIG. 14 is a perspective view of a ground contact 294 in accordance with an exemplary embodiment.

FIG. 15 illustrates a portion of the first electrical connector showing mating ends 264 of the signal and ground contacts.

FIG. 16 is a perspective view of a ground contact 294 in accordance with an exemplary embodiment.

FIG. 17 is a perspective view of another ground contact in accordance with an exemplary embodiment.

FIG. 30 shows a portion of the second circuit card assembly poised for mating with the first circuit card assembly.

FIG. 31 shows a portion of the second circuit card assembly partially mated with the first circuit card assembly.

FIG. 32 shows a portion of the second circuit card assembly fully mated with the first circuit card assembly.

FIG. 33 is an end view of the first circuit card assembly and the second circuit card assembly during mating.

FIG. 34 is an end view of the first circuit card assembly and the second circuit card assembly in a mated position.

DETAILED DESCRIPTION OF THE INVENTION

Figure 1:
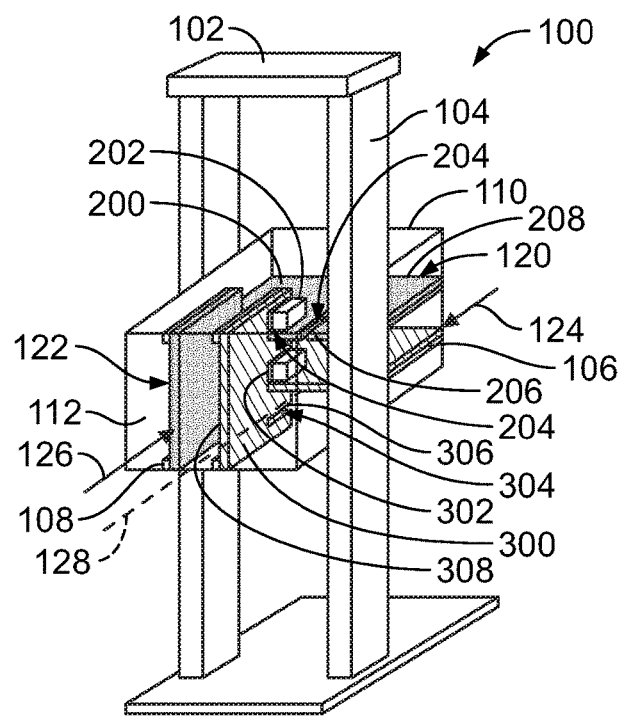
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

Figure 2:
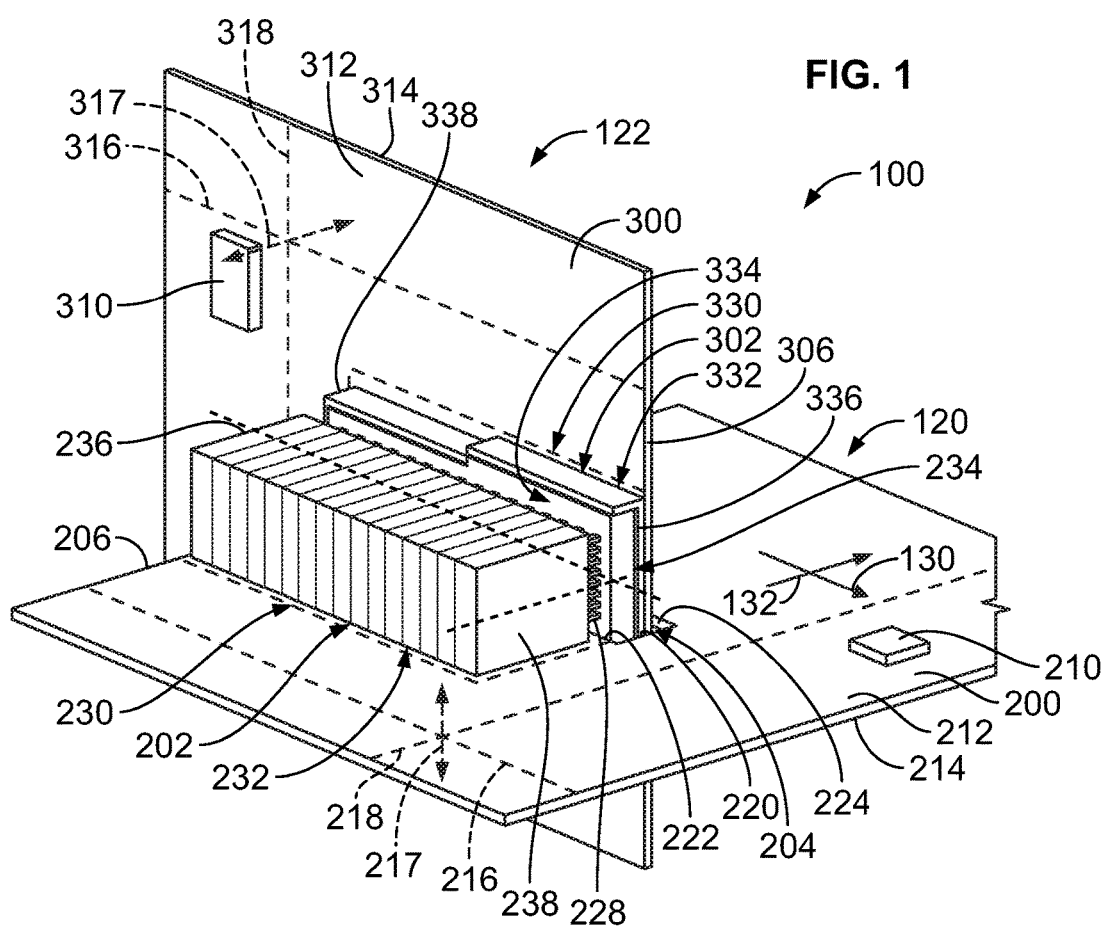
FIG. 2 is a perspective view of a portion of the communication system showing a first circuit card assembly coupled to a second circuit card assembly.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components 210 thereon. For example, the electrical components 210 (such as shown in FIG. 2) may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components 310 (such as shown in FIG. 2) thereon. For example, the electrical components 310 may be processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the first and second electrical connectors 202, 302 to be mated in a connector mating direction perpendicular to the loading directions 124, 126. In an exemplary embodiment, the contacts of the first and second electrical connectors 202, 302 are configured to allow mating in an angled contact mating direction, such as due to loading of the first and second PCB(s) 200, 300 and mating of the first and second electrical connectors 202, 302. For example, the first and second PCBs 200, 300 may be loaded in a board loading direction 130 (shown in FIG. 2), while the first and second electrical connectors 202, 302 are mated in a connector mating direction 132 (shown in FIG. 2), perpendicular to the board loading direction 130 causing the contacts to be mated in a direction non-parallel to the board loading direction 130 and non-parallel to the connector mating direction 132.

Having the first and second circuit card assemblies 122 internested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110. The arrangement may allow the PCBs 200, 300 to overlap to reduce one or more dimensions of the communication system 100, such as a front to rear length of the communication system 100.

Figure 3:
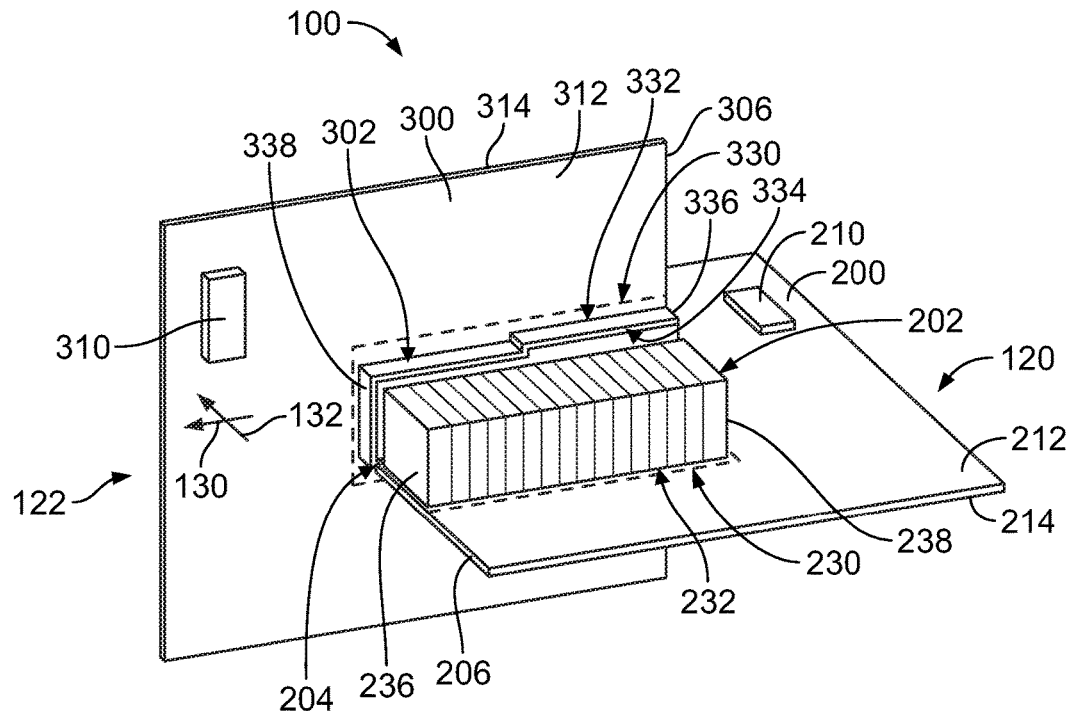
FIG. 3 is a perspective view of a portion of the communication system showing the first circuit card assembly coupled to the second circuit card assembly.
Figure 4:
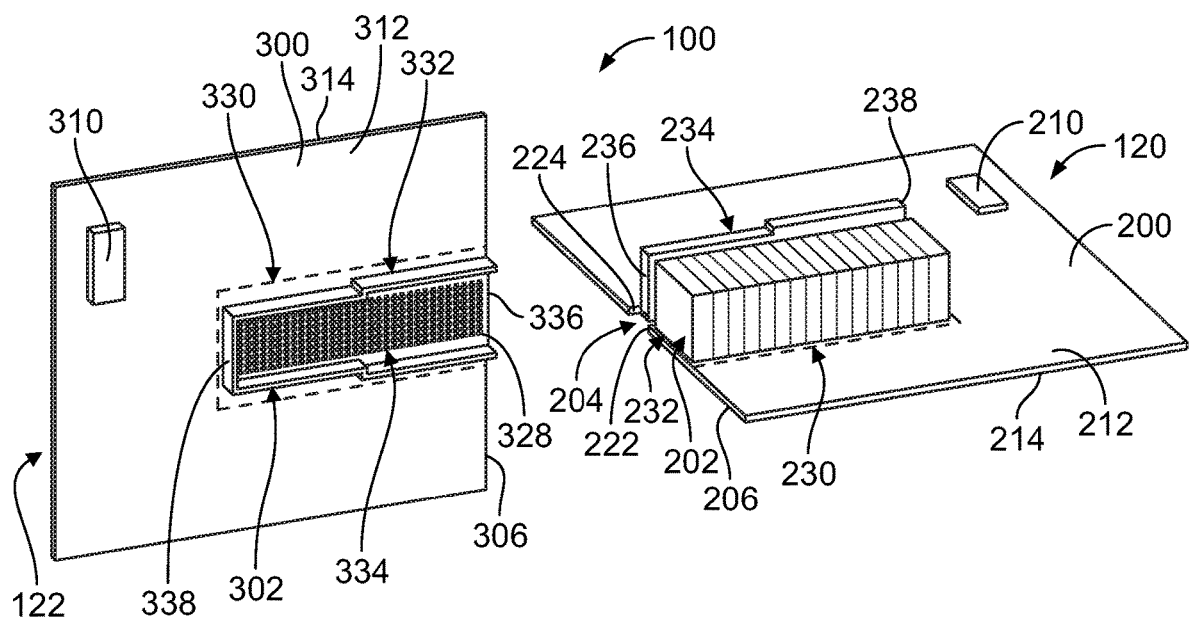
FIG. 4 is a perspective view of a portion of the communication system showing the first circuit card assembly and the second circuit card assembly poised for mating.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is a perspective view of a portion of the communication system 100 showing the first circuit card assembly 120 coupled to the second circuit card assembly 122. FIG. 4 is a perspective view of a portion of the communication system 100 showing the first circuit card assembly 120 and the second circuit card assembly 122 poised for mating. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label.

The first circuit card assembly 120 includes the first PCB 200 having the first slot 204 and the electrical connector 202 mounted to the PCB 200 proximate to the first slot 204. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 (shown in FIGS. 4 and 5) remote from the mating edge 206. The first slot 204 has first and second side edges 222, 224 extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 that extend through the electrical connector 202 may be soldered to the PCB 200 at the mounting area 230. In an exemplary embodiment, the electrical connector 202 includes both signal contacts and ground contacts. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122. For example, additional electrical connectors 202 may be provided on both sides of the first slot 204 and/or both sides of the PCB 200.

The first electrical connector 202 is mounted to the first PCB 200 at the mounting area 230. In the illustrated embodiment, the electrical connector 202 is a right angle connector having a mounting end 232 perpendicular to a mating end 234. For example, the mounting end 232 may be provided at a bottom of the electrical connector 202 and the mating end 234 may be provided at a side of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than forward for mating in the connector mating direction 132 generally perpendicular to the board loading direction 130. For example, the mating end 234 is perpendicular to the mating edge 206 of the PCB 200. The front 236 is oriented generally vertically along the transverse axis 217 and extends parallel to the secondary axis 218. The front 236 may be positioned a first distance from the mating edge 206 (either forward of, rearward of or flush with the mating edge 206) and the rear 238 is positioned a second distance from the mating edge 206 greater than the first distance. The mating end 234 spans a majority of the distance between the front 236 and the rear 238. The front 236 is forward facing and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. In the illustrated embodiment, the first surface 312 defines a first side and the second surface 314 defines a second side of the PCB 300; however, the PCB 300 may have other orientations in alternative embodiments. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 1). In an exemplary embodiment, the secondary axis 318 is parallel to the mating edge 306.

In an exemplary embodiment, a portion of the second PCB 300 is configured to be received in the first slot 204 that may at least partially fill the first slot 204. Such portion may engage the end edge 220, the first side edge 222 and/or the second side edge 224 of the first slot 204 when received therein.

The second PCB 300 includes a mounting area 330 for the electrical connector 302 on the first surface 312. The mounting area 330 extends along the mating edge 306 a distance. The electrical connector 302 is terminated to the PCB 300 at the mounting area 330. For example, contacts 328 of the electrical connector 302 may be soldered to the PCB 300 at the mounting area 330. In an exemplary embodiment, the electrical connector 302 includes signal contacts and ground contacts. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. Optionally, the mounting end 332 and the mating end 334 may be parallel to each other and non-coplanar. The electrical connector 302 extends between a front 336 and a rear 338 opposite the front 336. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300 for mating with the first electrical connector 202 in the connector mating direction 132 generally perpendicular to the board loading direction 130. The front 336 is oriented generally vertically and extends parallel to the secondary axis 318. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. During mating, the contacts 228 and/or 328 are moved with the corresponding PCB 200, 300 in the board loading direction 130 (for example, parallel to the primary axes 216, 316 of the PCBs 200, 300) and the contacts 228 and/or 328 are moved with the corresponding electrical connector 202, 302 in the connector mating direction 132 (for example, sideways or perpendicular to the board loading direction 130) as the first and second electrical connectors 202, 302 are moved toward each other. Such compound movements cause the contacts 228, 328 to be mated at an angle along a contact mating direction 134 (shown in FIG. 14) that is non-parallel to the board loading direction 130 and that is non-parallel to the connector mating direction 132.

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
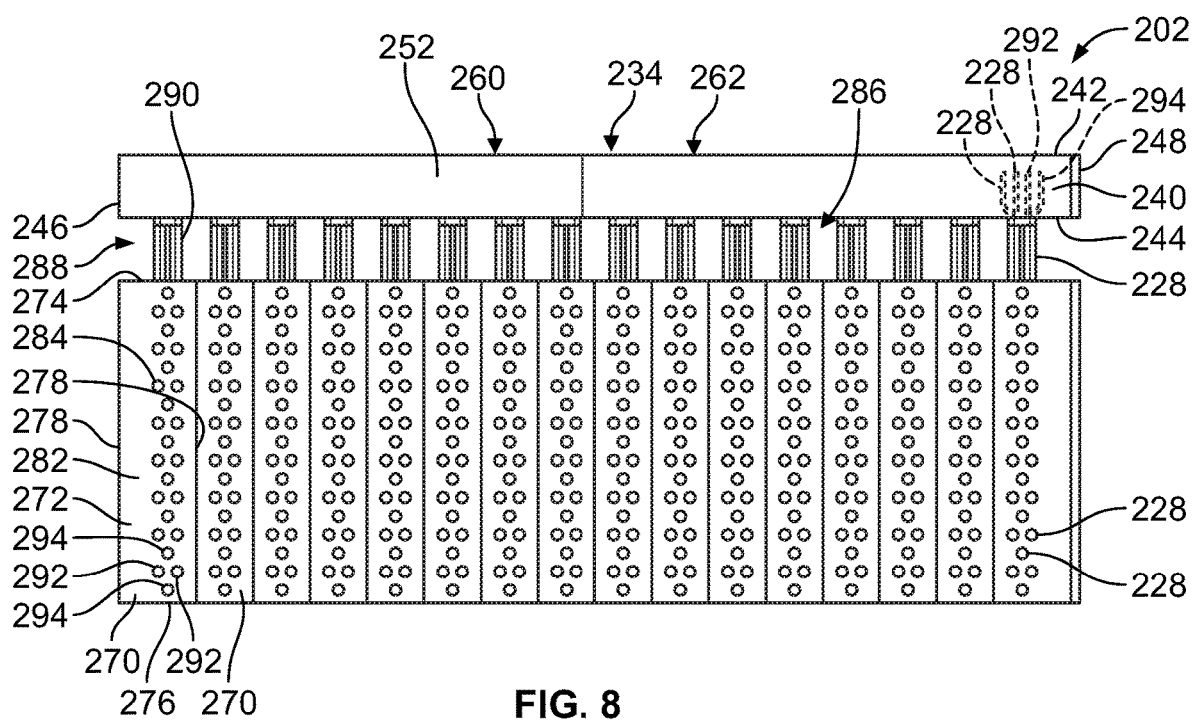
FIG. 8 is a bottom view of a first electrical connector of the first circuit card assembly in accordance with an exemplary embodiment.
Figure 9:
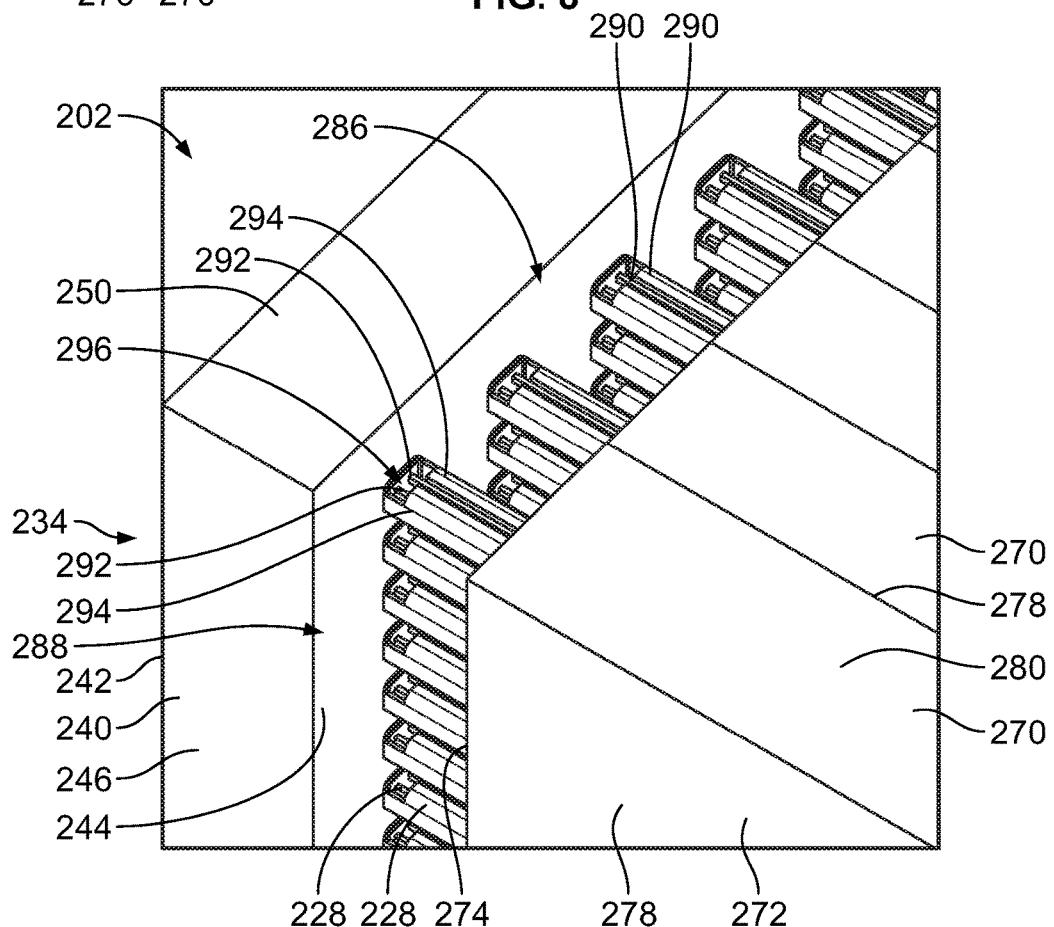
FIG. 9 is a perspective view of a portion of the first electrical connector in accordance with an exemplary embodiment.
Figure 10:
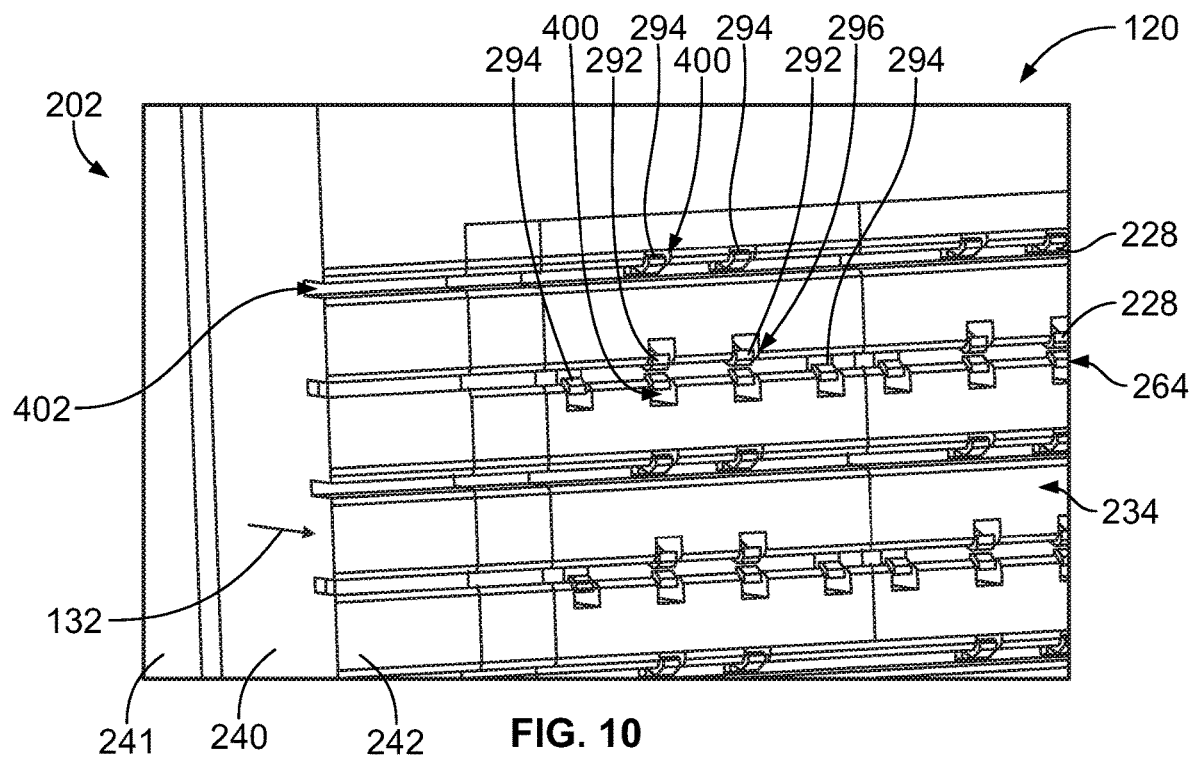
FIG. 10 is an end view of a portion of the first electrical connector in accordance with an exemplary embodiment.
Figure 11:
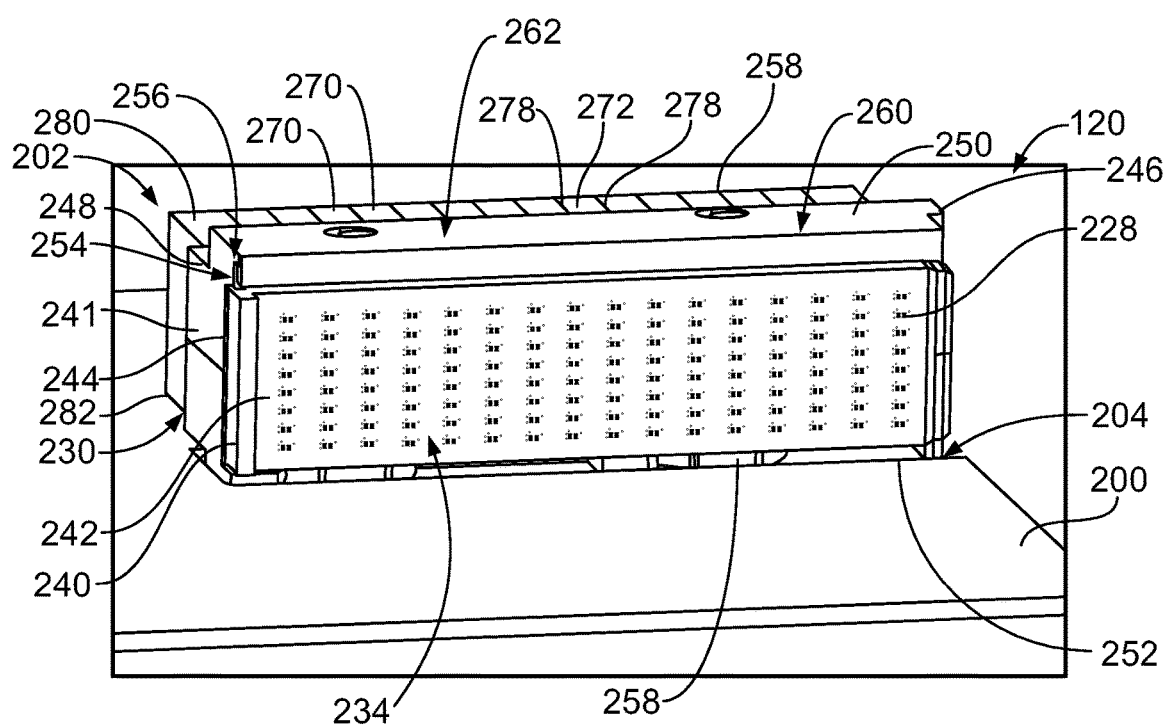
FIG. 11 is a top perspective view of a portion of the first circuit card assembly showing the first electrical connector mounted to a first PCB.

FIG. 8 is a bottom view of the first electrical connector 202 in accordance with an exemplary embodiment. FIG. 9 is a perspective view of a portion of the first electrical connector 202 in accordance with an exemplary embodiment. FIG. 10 is an end view of a portion of the first electrical connector 202 in accordance with an exemplary embodiment. FIG. 11 is a top perspective view of a portion of the first circuit card assembly 120 showing the first electrical connector 202 mounted to the first PCB 200 at the mounting area 230 adjacent the first slot 204.

In an exemplary embodiment, the first electrical connector 202 includes a mating housing 240 at the mating end 234 and a shell 241 (FIGS. 10 and 11) surrounding at least a portion of the mating housing 240. The shell 241 is not illustrated in FIGS. 2-9 to illustrate other components of the electrical connector 202 and may be an optional component. Optionally, the mating housing 240 may be movable within the shell 241, such as in the connector mating direction 132. The mating housing 240 includes a first side 242, a second side 244, a front 246 and a rear 248. The first side 242 defines the mating end 234 of the electrical connector 202. The mating end 234 is oriented perpendicular to the first PCB 200. In an exemplary embodiment, the mating housing 240 holds the contacts 228 for mating with the second electrical connector 302 (shown in FIG. 2). For example, each of the contacts 228 includes a mating end 264 (FIG. 10) at the first side 242 for mating with the second electrical connector 302. The mating ends 264 are provided at the first side 242 in a predetermined layout for mating with the second electrical connector 302.

The electrical connector 202 includes a top 250 and a bottom 252. In an exemplary embodiment, the top 250 and the bottom 252 include connecting elements 254 (FIG. 11) for connecting the first electrical connector 202 to the second electrical connector 302. In the illustrated embodiment, the connecting elements 254 are defined by grooves 256 in the shell 241 at the top 250 and the bottom 252 configured to receive portions of the second electrical connector 302. The connecting elements 254 secure the shell 241 to the second electrical connector 302 as the electrical connectors 202, 302 are coupled together (for example, as the PCBs 200, 300 are moved in the board loading direction). Other types of connecting elements 254 may be provided in alternative embodiments, such as pins, clips, fasteners, and the like.

Optionally, the electrical connector 202 may include cam levers 258 (FIG. 11) at the top 250 and the bottom 252 for actuating the mating housing 240 relative to the shell 241 during mating. The cam levers 258 may be held by the shell 241 and operably coupled to the mating housing 240 to move the mating housing 240 sideways in the connector mating direction 132. The cam levers 258 may be actuated by the second electrical connector 302 as the first and second electrical connectors 302 are coupled together. For example, actuators, such as ramps, may be provided on the second electrical connector 302 to actuate the cam levers 258 as the cam levers slide along the ramps. In an exemplary embodiment, multiple cam levers 258 are provided, such as at a front section 260 and a rear section 262 of the electrical connector 202.

In an exemplary embodiment, the electrical connector 202 includes contact modules 270 each holding a plurality of the contacts 228. The contact modules 270 may be coupled to the shell 241 and/or the mating housing 240, such as at the second side 244. In an exemplary embodiment, each contact module 270 includes a dielectric body 272 holding corresponding contacts 228. For example, the dielectric body 272 may be overmolded around portions of the contacts 228. Optionally, the contact modules 270 may include ground shields (not shown) to provide electrical shielding for the contacts 228.

The contact modules 270 each have a first side 274 facing the mating housing 240 and a second side 276 opposite the first side 274. The contact module 270 includes sides 278 facing each other when the contact modules 270 are stacked front to rear within the electrical connector 202. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contact module 270 includes a top 280 and a bottom 282. The bottom 282 is configured to be mounted to the first PCB 200 (shown in FIG. 2). Optionally, portions of the contacts 228 may extend below the bottom 282 for termination to the first PCB 200. For example, each of the contacts 228 may include a terminating end 284 (FIG. 8) configured to be terminated to the first PCB 200. For example, the terminating end 284 may be a compliant pin, such as an eye of the needle pin, configured to be press-fit into plated vias in the first PCB 200. In other various embodiments, the terminating end 284 may be a solder tail or another type of terminating end.

In an exemplary embodiment, the electrical connector 202 includes a compliant section 286 between the contact modules 270 and the mating housing 240 that allows the mating housing 240 to shift relative to the contact modules 270, such as during mating with the second electrical connector 302. For example, the contact modules 270 may not engage the mating housing 240 in various embodiments. Rather, a gap 288 may be provided between the first sides 274 of the contact modules 270 and the second side 244 of the mating housing 240. The contacts 228 may span the gap 288 between the contact modules 270 and the mating housing 240. The contacts 228 include flexible sections 290 between the mating ends 264 and the terminating ends 284 to allow relative movement of the contacts 228 and the mating housing 240. The flexible sections 290 may be defined by sections of the contacts 228 that are not encased or enclosed by the dielectric body 272 and/or do not extend through the mating housing 240. For example, the flexible sections 290 may be located in the gap 288. Optionally, the flexible sections 290 may be enclosed or shrouded by a portion of the electrical connector 202, such as a shroud extending from the second side 244 of the mating housing 240 or a separate housing component.

In an exemplary embodiment, the contacts 228 include signal contacts 292 and ground contacts 294. Optionally, the signal contacts 292 may be arranged in pairs 296 configured to convey differential signals. The ground contacts 294 are interspersed with the signal contacts 292 to provide electrical shielding for the signal contacts 292. For example, the ground contacts 294 may be provided between the pairs 296 of signal contacts 292. Optionally, the ground contacts 294 may be provided above, below, and/or between the various pairs 296 of signal contacts 292. The signal contacts 292 and/or the ground contacts 294 may be stamped and formed contacts.

As shown in FIG. 10, the mating housing 240 includes contact channels 400 holding the contacts 228. Optionally, the contacts 228 may be encased in the mating housing 240 such that the contacts 228 are contained in the contact channels 400 and do not extend forward of the first side 242; however, in alternative embodiments, the contacts 228 may extend beyond the first side 242. In an exemplary embodiment, the mating housing 240 includes slots 402 aligned with corresponding contact channels 400. The slots 402 are configured to receive the second contacts 328 (shown in FIG. 19) of the second electrical connector 302 (shown in FIG. 19). For example, the second contacts 328 may slide in the slots 402 to mate with the corresponding first contacts 228 during the mating process. For example, the tips of the second contacts 328 are received in the slots 402 as the first electrical connector 202 is moved in the connector mating direction 132. The second contacts 328 slide in the slots 402 as the PCBs 200, 300 are moved in the board loading direction 130 and are eventually aligned with the corresponding first contacts 228. The slots 402 allow rearward movement and inward movement in the board loading direction 130 and the connector mating direction 132 during the mating process. The slots 402 guide mating of the first contacts 228 with the second contacts 328. Optionally, the contact channels 400 may provide clearance or space for the first contacts 328 to deflect during mating.

As shown in FIG. 11, the bottoms 282 of the contact modules 270 are mounted to the PCB 200. In an exemplary embodiment, the mating housing 240 is positioned above the first slot 204 for mating with the second electrical connector 302 (shown in FIG. 2). In an exemplary embodiment, the mating housing 240 is movable relative to the PCB 200 and the contact modules 270, which are fixed to the PCB 200. For example, the flexible sections 290 of the contacts 228 defining the compliant section 286 of the electrical connector 202 allow the mating housing 240 to move in the connector mating direction 132 relative to the PCB 200 during mating with the second electrical connector 302.

FIG. 12 is a perspective view of a portion of one of the signal contacts 292 formed in accordance with an exemplary embodiment showing the mating end 264 forward of the flexible section 290 (shown in FIG. 9) and forward of the dielectric body 272 (shown in FIG. 9). The signal contact 292 includes a base conductor 410, a dielectric shroud 412 around the base conductor 410 and a mating beam 414 extending from the base conductor 410 out of the dielectric shroud 412 to the mating end 264 for mating with a mating contact, such as the second contact 328 (shown in FIG. 19) of the second electrical connector 302 (shown in FIG. 19). In an exemplary embodiment, the dielectric shroud 412 is overmolded over the base conductor 410; however, the dielectric shroud 412 may cover the base conductor 410 by other means in alternative embodiments, such as clipping onto the side of the base conductor 410 or loading the base conductor 410 into the dielectric shroud 412. In an exemplary embodiment, the signal contact 292 is stamped and formed.

In the illustrated embodiment, the mating beam 414 defines a socket 416 configured to receive the corresponding second contact 328. For example, the mating beam 414 includes an upper beam member 420 and a lower beam member 422. The upper and lower beam members 420, 422 are deflectable beams configured to receive the second contact 328 therebetween. In an exemplary embodiment, the upper and lower beam members 420, 422 are bent or formed to converge toward each other and are configured to be deflected outward away from each other by the second contact 328 when mated thereto. Other types of mating beams 414 may be provided in alternative embodiments, including a single beam member, a pin, a blade or another type of contact. In the illustrated embodiment, each beam member 420, 422 has a mating side 424 extending between a leading edge 426 and a trailing edge 428. The mating side 424 defines a mating interface configured to engage the mating contact 328 when mated thereto. The mating beam 414 extends along a beam axis 430 between the base conductor 410 and tips 432 of the beam members 420, 422 at distal ends thereof.

The dielectric shroud 412 surrounds portions of the base conductor 410 to electrically isolate the signal contact 292 from the ground contacts 294 (shown in FIG. 11). Optionally, the dielectric shroud 412 may include flat sides 434 to support and position the ground contacts 294 relative to the signal contact 292. For example, the dielectric shroud 412 may include a top side, a bottom side, an inner side and an outer side any of which may support and locate part of the ground contact 294.

FIG. 13 is a perspective view of one of the ground contacts 294 in accordance with an exemplary embodiment showing the mating end 264 forward of the flexible section 290 (shown in FIG. 9) and forward of the dielectric body 272 (shown in FIG. 9). FIG. 14 is a perspective view of another of the ground contacts 294 in accordance with an exemplary embodiment. In an exemplary embodiment, the ground contacts 294 shown in FIGS. 13 and 14 are left and right halves of a pair of contacts configured to provide electrical shielding for a pair of signal contacts 292. The ground contacts 294 shown in FIGS. 13 and 14 are configured to be electrically connected to each other.

Figure 19:
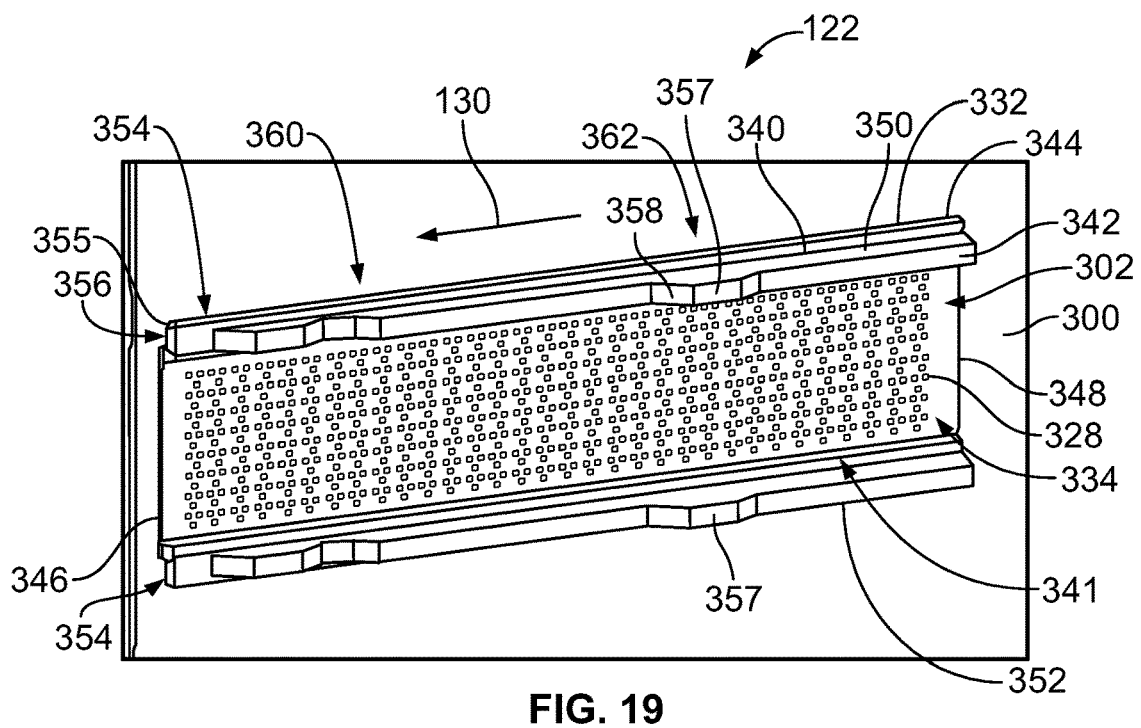
FIG. 19 is a perspective view of a portion of the second circuit card assembly in accordance with an exemplary embodiment.

Each ground contact 294 includes a base conductor 450, a first mating beam 452 and a second mating beam 454 extending from the base conductor 450 for mating with a mating contact, such as the corresponding second contact 328 (shown in FIG. 19) of the second electrical connector 302 (shown in FIG. 19). The base conductor 450 includes a first wall 456 and a second wall 458 bent relative to the first wall 456, such as perpendicular to the first wall 456. In the illustrated embodiment, the first mating beam 452 extends from the first wall 456 and the second mating beam 454 extends from the second wall 458; however, other arrangements are possible in alternative embodiments.

In an exemplary embodiment, one or both of the ground contacts 294 may include grounding tabs 460 configured to engage and electrically connect to the other of the ground contacts 294. For example, in the illustrated embodiment, the grounding tabs 460 extend from the first wall 456. In the illustrated embodiment, each mating beam 452, 454 has a mating side 464 extending between a leading edge 466 and a trailing edge 468. The mating side 464 defines a mating interface configured to engage the mating contact 328 when mated thereto. The mating beams 452, 454 extend along a beam axis between the base conductor 450 and a tip 472 of the beam member 452, 454 at distal ends thereof. The mating beams 452, 454 may be curved between a base 470 and the tip 472 to define a curved mating interface.

FIG. 15 illustrates a portion of the first electrical connector 202 showing the mating ends 264 of the signal and ground contacts 292, 294. A portion of the mating housing 240 is removed to illustrate the mating ends 264. The signal contacts 292 are arranged in pairs. The ground contacts 294 surround the pairs of signal contacts 292 to provide electrical shielding for the signal contacts 292. In the illustrated embodiment, the ground contacts 294 provide shielding on four sides of the signal contacts 292. For example, the signal contacts 292 are shielded on both sides by the mating beams 454, the signal contacts 292 are shielded above by the mating beams 452 and the signal contacts 292 are shielded below by the ground contacts 294 associated with the signal contacts below.

In an exemplary embodiment, the first and second walls 456, 458 of the base conductors 450 are seated against the corresponding dielectric shrouds 412. Each first wall 456 extends along a first side (for example, a top side) of the corresponding signal contact 292 and each second wall extends along a second side (For example, the outer side) of the corresponding signal contact 292. The first and second walls 456, 458 extend along the base conductors 410 of the signal contacts 292. Each first mating beam 452 is aligned with the corresponding mating beam 414 of the corresponding signal contact 292 and extends along the first side (For example, the top side) of the corresponding signal contact 292. Each second mating beam 454 is aligned with the mating beam 414 of the corresponding signal contact 292 and extends along the second side (for example, the outer side) of the corresponding signal contact 292. In an exemplary embodiment, the first and second mating beams 452, 454 are flared outward from the first and second walls 456, 458. For example, the first and second mating beams 452, 454 are bent out of the planes of the first and second walls 456, 458 such that the first and second mating beams 452, 454 are further from the signal contacts 292 than the first and second walls 456, 458. Flaring the mating beams 452, 454 separates the mating beams 452, 454 from the mating beams 414 of the signal contacts 292 to avoid inadvertent touching or shorting. The mating beams 452, 454 are flared to provide a mating interface that corresponds to the mating interface of the second electrical connector 302. For example, the mating beams 452, 454 are located to mate with the corresponding second contacts 328 (shown in FIG. 19).

FIG. 16 is a perspective view of one of the ground contacts 294 in accordance with an exemplary embodiment showing the mating end 264 forward of the flexible section 290 (shown in FIG. 9) and forward of the dielectric body 272 (shown in FIG. 9). FIG. 17 is a perspective view of another of the ground contacts 294 in accordance with an exemplary embodiment. In an exemplary embodiment, the ground contacts 294 shown in FIGS. 16 and 17 are left and right halves of a pair of contacts configured to provide electrical shielding for a pair of signal contacts 292. The ground contacts 294 shown in FIGS. 16 and 17 are similar to the ground contacts 294 shown in FIGS. 13 and 14; however, the ground contacts 294 shown in FIGS. 16 and 17 have the first and second mating beams 452, 454 extending from the second wall 458. The first mating beam 452 does not extend from the first wall 458 in the illustrated embodiment.

Figure 18:
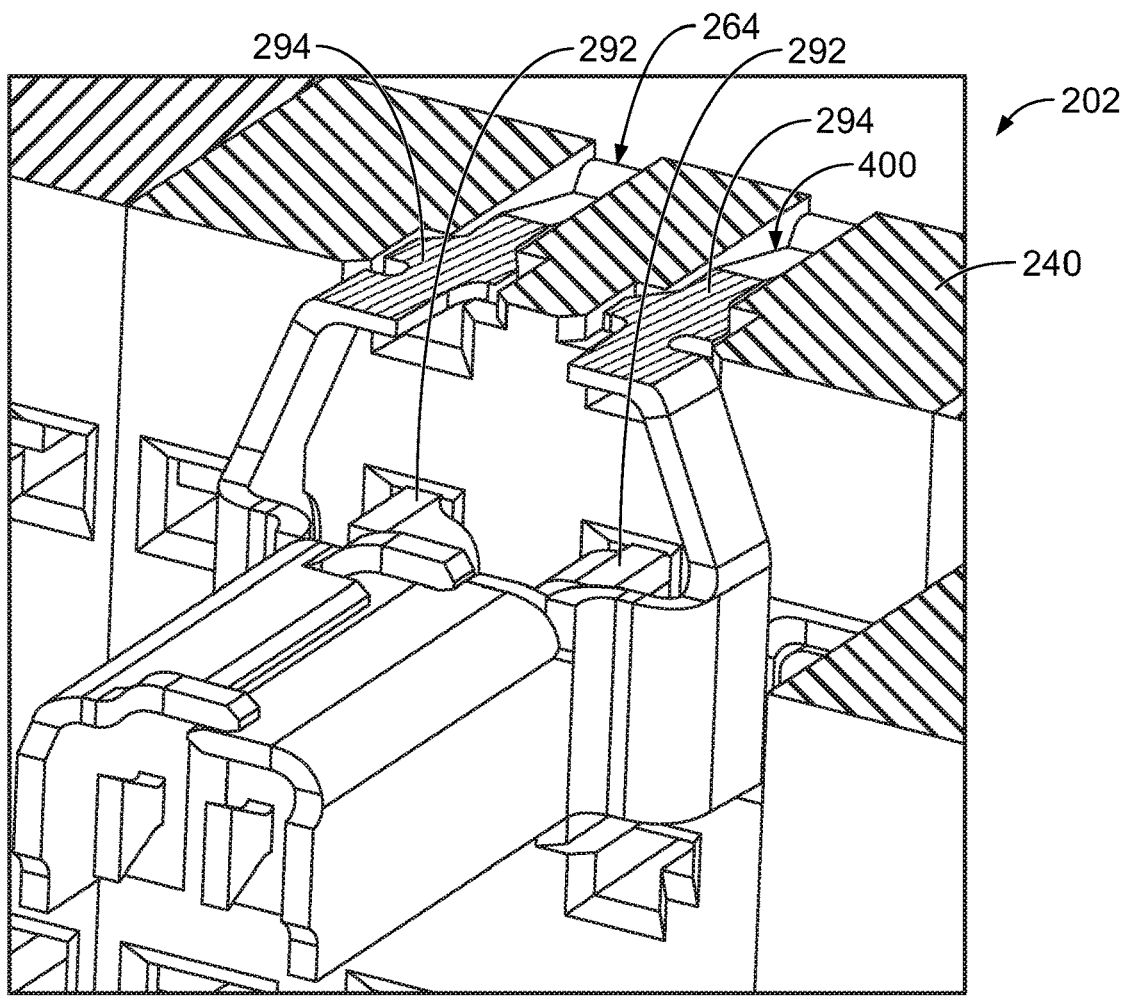
FIG. 18 illustrates a portion of the first electrical connector showing mating ends 264 of the signal and ground contacts.

FIG. 18 illustrates a portion of the first electrical connector 202 showing the mating ends 264 of the signal and ground contacts 292, 294 showing the embodiment of the ground contacts 294 shown in FIGS. 16 and 17. A portion of the mating housing 240 is removed to illustrate the mating ends 264. The signal contacts 292 are arranged in pairs. The ground contacts 294 surround the pairs of signal contacts 292 to provide electrical shielding for the signal contacts 292. The signal contacts 292 are received in corresponding contact channels 400. The ground contacts 294 are received in corresponding contact channels 400.

Figure 20:
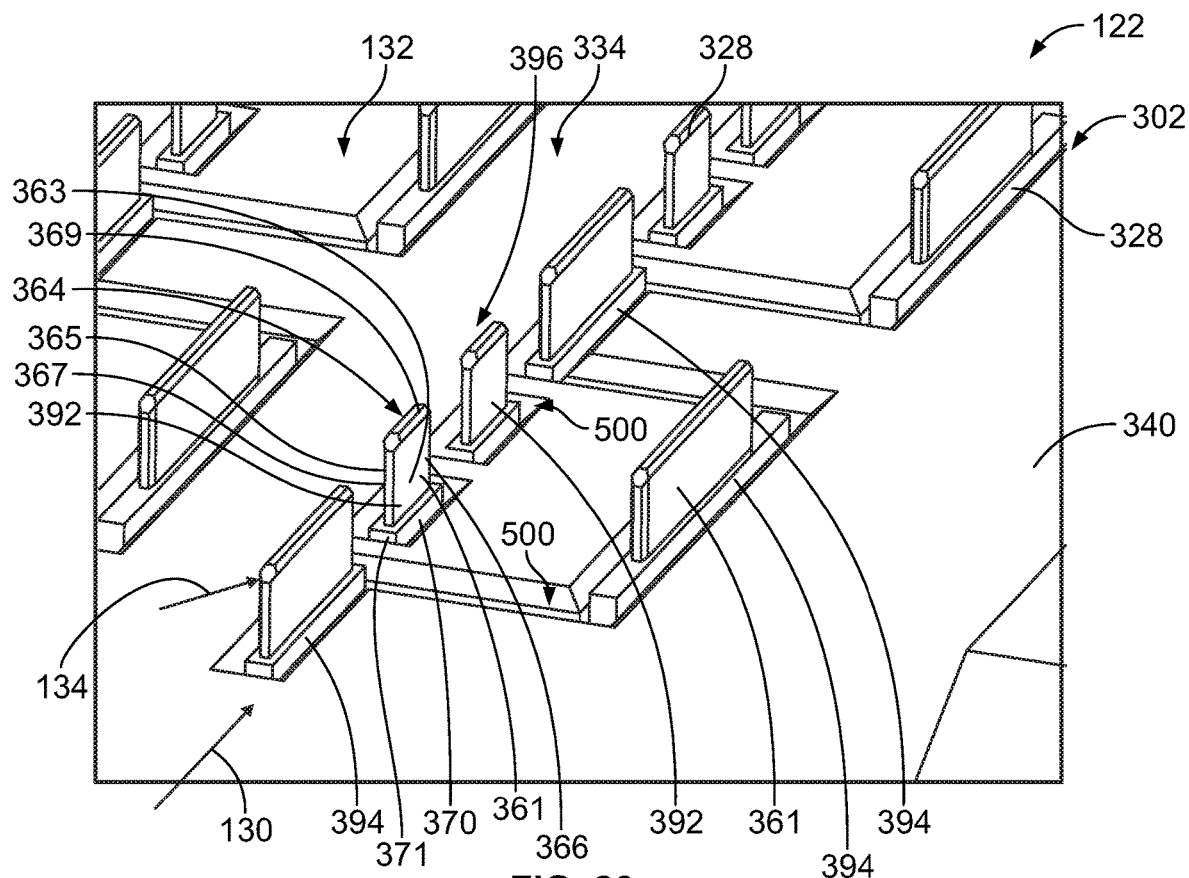
FIG. 20 is a perspective view of a portion of the second electrical connector in accordance with an exemplary embodiment.
Figure 21:
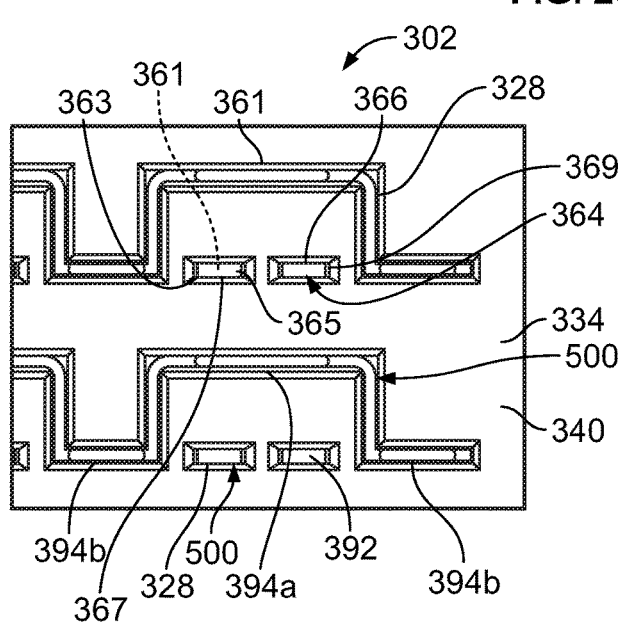
FIG. 21 is an end view of a portion of the second electrical connector.
Figure 22:
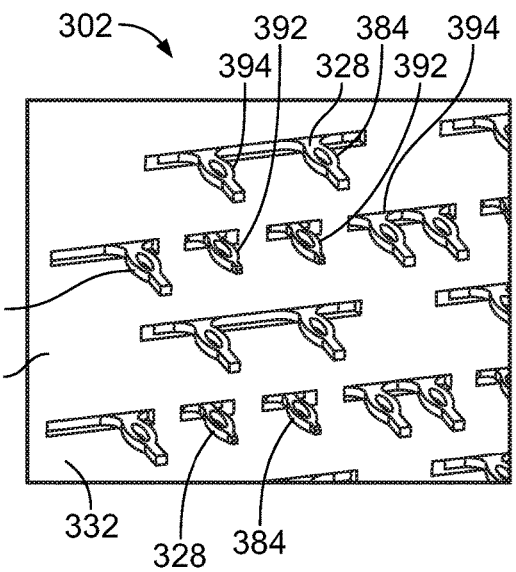
FIG. 22 is a perspective view of a portion of the second electrical connector.

FIG. 19 is a perspective view of a portion of the second circuit card assembly 122 in accordance with an exemplary embodiment. FIG. 20 is a perspective view of a portion of the second electrical connector 302 in accordance with an exemplary embodiment. FIG. 21 is an end view of a portion of the second electrical connector 302 showing a mating interface of the second electrical connector 302. FIG. 22 is a perspective view of a portion of the second electrical connector 302 showing the mounting side of the second electrical connector 302. In an exemplary embodiment, the electrical connector 302 includes a housing 340 holding the contacts 328. The housing 340 includes walls defining a cavity 341 configured to receive the mating housing 240 of the first electrical connector 202 (both shown in FIG. 11).

The housing 340 includes a first side 342, a second side 344, a front 346 and a rear 348. The first side 342 defines the mating end 334 of the electrical connector 302. The mating end 334 is oriented parallel to the second PCB 300. In an exemplary embodiment, the housing 340 holds the contacts 328 for mating with the first electrical connector 202. For example, each of the contacts 328 includes a mating end 364 (FIG. 20) exposed at or beyond the first side 342 for mating with the first electrical connector 202. The mating ends 364 are provided at the first side 342 in a predetermined layout for mating with the first electrical connector 202. The mating end 364 includes one or more mating beams 361 extending between a leading end 363 and a trailing end 365. The mating beam 361 has one or more mating interfaces 366 at one or more of the side faces 367 of the mating beam 361. In the illustrated embodiment, the mating beam 361 is a blade contact; however, other types of mating beams are possible in alternative embodiments. Each mating beam 361 extends from a tip 369 to a base 370. Each mating beam 361 extends generally along a beam axis 371 between the base 370 and the tip 369. The mating beam 361 is configured for mating at an angle, non-parallel to the beam axis 371, such as in the contact mating direction 134 due to the PCBs 200, 300 moving in the board loading direction 130 and the first electrical connector 202 mating in the connector mating direction 132. Optionally, the contact mating direction 134 may be at an angle of between approximately 30° and 60° relative to the beam axis 371. The compound movements of the first and second electrical connectors 202, 302 causes the contacts 328 to be mated non-parallel to the beam axes 371. The contacts 328 may be loaded into the sockets 416 defined by the first contacts 228. The contacts 328 may slide sideways within the sockets 416 and slide downward into the sockets 416 during mating.

The housing 340 includes a top 350 and a bottom 352. In an exemplary embodiment, the top 350 and the bottom 352 include connecting elements 354 for connecting the second electrical connector 302 to the first electrical connector 202. In the illustrated embodiment, the connecting elements 354 include pockets 356 defined by ledges 355 at the top 350 and the bottom 352. The pockets 356 are configured to receive corresponding connecting elements 254 (shown in FIG. 11) of the first electrical connector 202. The ledges 355 are configured to be received in corresponding grooves 256 (shown in FIG. 11). Other types of connecting elements 354 may be provided in alternative embodiments, such as pins, clips, fasteners, and the like.

The housing 340 includes actuators 357 at the first side 342 configured to actuate the cam levers 258 (shown in FIG. 11). The actuators 357 include ramp surfaces 358 that engage the cam levers and actuate the cam levers 258 as the cam levers 258 ride along the housing 340 during mating of the first and second electrical connectors 202, 302. In the illustrated embodiment, the housing 340 includes multiple actuators 357 laterally spaced apart, such as for actuating multiple cam levers 258. For example, the housing 340 may include actuators 357 along both the top 350 and the bottom 352 at both a front section 360 and a rear section 362 of the housing 340. Optionally, the actuators 357 may be at different heights, such as shorter at the front section 360 and taller at the rear section 362 to allow actuation of different cam levers 258.

The housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends 384 (FIG. 22), such as compliant pins, solder tails, and the like, configured to be terminated to the PCB 300.

In an exemplary embodiment, the contacts 328 include signal contacts 392 and ground contacts 394. Optionally, the signal contacts 392 may be arranged in pairs 396 configured to convey differential signals (differential pairs of signal contacts); however, the signal contacts 392 may convey single-ended signals rather than differential signals. The ground contacts 394 are interspersed with the signal contacts 392 to provide electrical shielding for the signal contacts 392. For example, the ground contacts 394 may be provided between the pairs 396 of signal contacts 392 in the same column and/or the ground contacts 394 may be provided between the pairs 396 of signal contacts 392 in the same row.

As shown in FIG. 20-22, the contacts 328 are held in the housing 340 in corresponding contact channels 500. For example, the signal contacts 392 are received in corresponding contact channels 500 and the ground contacts 394 are received in corresponding contact channels 500. In an exemplary embodiment, the contacts 328 are loaded into the contact channels 500 through the first side 342, which is the side opposite the PCB 300; however, the contacts 328 may be loaded through the second side 344 in alternative embodiments. In an exemplary embodiment, the ground contacts 394 are electrically connected to other ground contacts 394 within the housing 340. For example, some of the contact channels 500 may be open to each other to allow direction connection of adjacent ground contacts 394 for electrically connecting the ground contacts 394.

Figure 23:
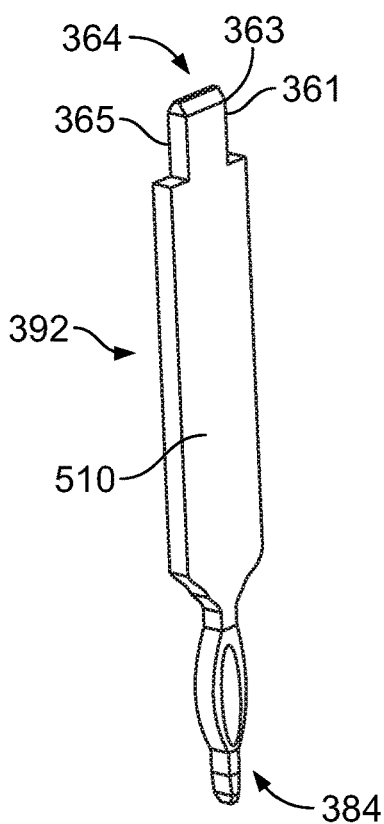
FIG. 23 is a perspective view of a signal contact 392 formed in accordance with an exemplary embodiment.

FIG. 23 is a perspective view of one of the signal contacts 392 formed in accordance with an exemplary embodiment showing the mating end 364 and the terminating end 384. The signal contact 392 includes a base conductor 510 between the mating beam 361 and the terminating end 384. Optionally, the mating beam 361 may be coined or otherwise formed to have a chamfered or angled leading end 363 and trailing end 365. The signal contact 392 may be generally planar and straight; however, the signal contact 392 may have other shapes in alternative embodiments.

Figure 24:
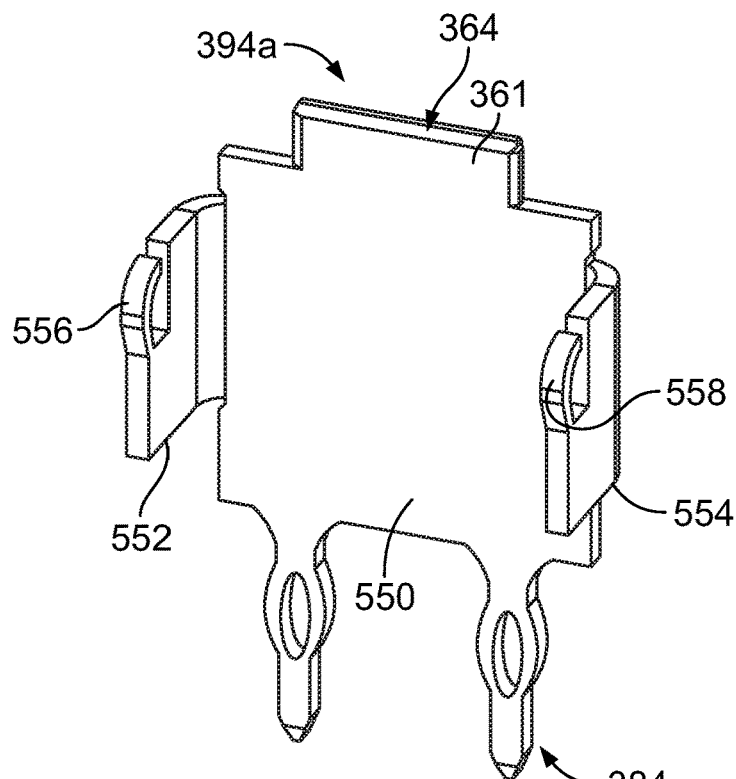
FIG. 24 is a perspective view of a ground contact in accordance with an exemplary embodiment.
Figure 25:
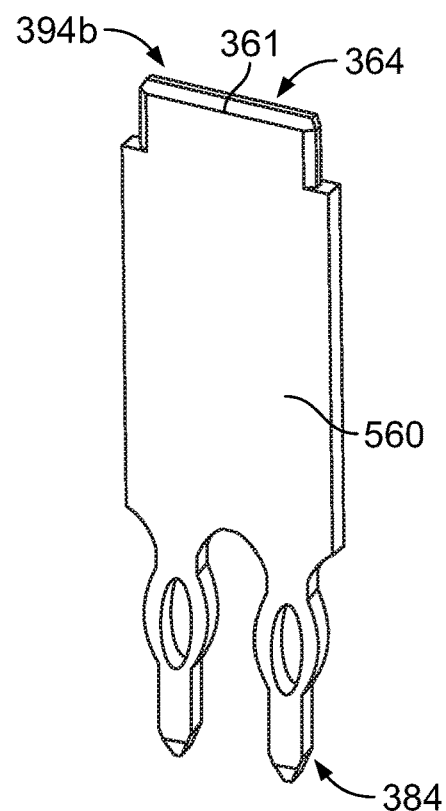
FIG. 25 is a perspective view of a ground contact in accordance with an exemplary embodiment.

FIG. 24 is a perspective view of one of the ground contacts 394a in accordance with an exemplary embodiment showing the mating end 364 and the terminating end 384. FIG. 25 is a perspective view of another of the ground contacts 394b in accordance with an exemplary embodiment. In an exemplary embodiment, the ground contacts 394a, 394b are configured to be electrically connected together to provide electrical shielding in the rows and the columns between corresponding signal contacts 392.

Each ground contact 394a includes a base conductor 550, a first connecting beam 552 extending from the base conductor 550 and a second connecting beam 554 extending from the base conductor 550. The mating beam 361 extends from the base conductor 550. The terminating end 384 extends from the base conductor 550. In the illustrated embodiment, two terminating ends 384 are provided; however, any number of terminating ends may be provided in alternative embodiments. The connecting beams 552, 554 have connecting tabs 556, 558 configured for electrical connection with the ground contact 394b. The connecting tabs 556, 558 may be deflectable, such as spring tabs configured to be deflected against the ground contact 394b.

Each ground contact 394b includes a base conductor 560. The mating beam 361 extends from the base conductor 560. The terminating end 384 extends from the base conductor 560. In the illustrated embodiment, two terminating ends 384 are provided; however, any number of terminating ends may be provided in alternative embodiments.

Returning to FIG. 21, when the ground contacts 394 are received in the contact channels 500, the ground contacts 394b are aligned with the rows of signal contacts 392. The ground contacts 394a form a U-shaped shielded cavity around the corresponding pair of signal contacts 392. The connecting tabs 556, 558 extend from the connecting beams 552, 554 to engage the base conductor 560 of the ground contact 394b. Other arrangements of the ground contacts 394 are possible in alternative embodiments to provide electrical shielding for the signal contacts 392.

Figure 26:
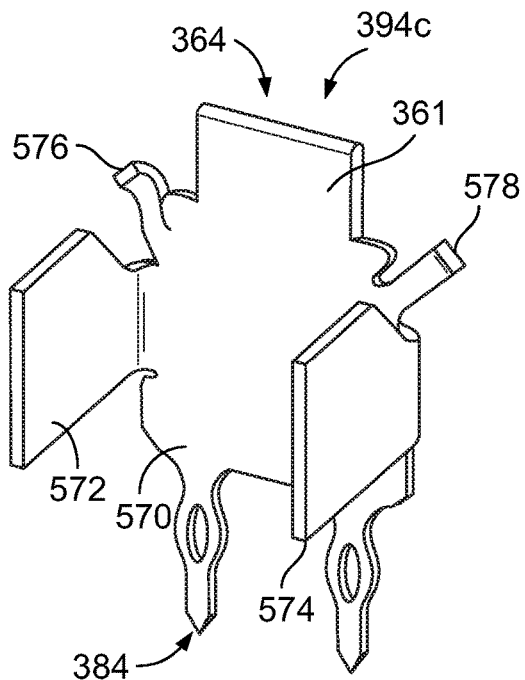
FIG. 26 is a perspective view of a ground contact in accordance with an exemplary embodiment.
Figure 27:
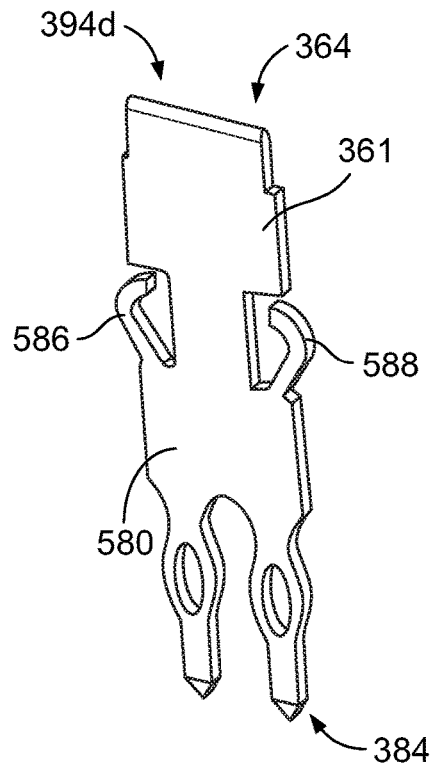
FIG. 27 is a perspective view of a ground contact in accordance with an exemplary embodiment.

FIG. 26 is a perspective view of one of the ground contacts 394c in accordance with an exemplary embodiment showing the mating end 364 and the terminating end 384. FIG. 27 is a perspective view of another of the ground contacts 394d in accordance with an exemplary embodiment. In an exemplary embodiment, the ground contacts 394c, 394d are configured to be electrically connected together to provide electrical shielding in the rows and the columns between corresponding signal contacts 392.

Each ground contact 394c includes a base conductor 570, a first connecting beam 572 extending from the base conductor 570 and a second connecting beam 574 extending from the base conductor 570. The mating beam 361 extends from the base conductor 570. The terminating end 384 extends from the base conductor 570. The base conductor 570 has connecting tabs 576, 578 extending therefrom configured for electrical connection with another ground contact 394c, such as to the connecting beams 572, 574 of an adjacent ground contact 394c. The connecting tabs 576, 578 may be deflectable, such as spring tabs configured to be deflected against the ground contact 394c.

Each ground contact 394d includes a base conductor 580. The mating beam 361 extends from the base conductor 580. The terminating end 384 extends from the base conductor 580. The base conductor 580 has connecting tabs 586, 588 extending therefrom configured for electrical connection with corresponding ground contacts 394c, such as to the connecting beams 572, 574 of the adjacent ground contacts 394c.

Figure 28:
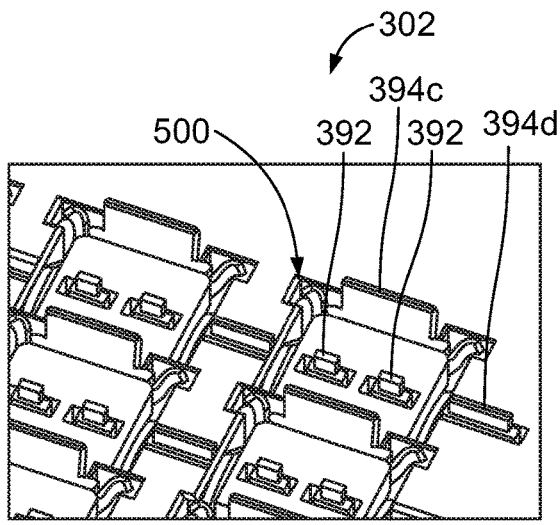
FIG. 28 is a perspective view of the second electrical connector in accordance with an exemplary embodiment.
Figure 29:
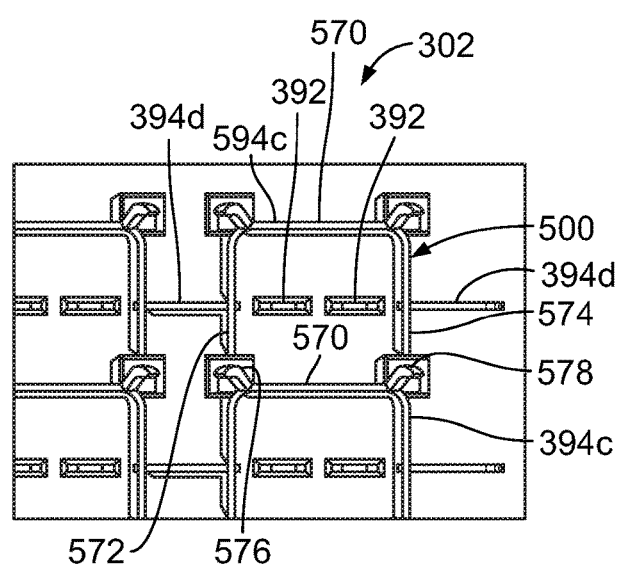
FIG. 29 is an end view of the second electrical connector.

FIG. 28 is a perspective view of the second electrical connector 302 having the ground contacts 394c, 394d in accordance with an exemplary embodiment. FIG. 29 is an end view of the second electrical connector 302 having the ground contacts 394c, 394d. The ground contacts 394 are received in corresponding contact channels 500. The ground contacts 394d are aligned with the rows of signal contacts 392. The ground contacts 394c form a U-shaped shielded cavity around the corresponding pair of signal contacts 392. The connecting tabs 576, 578 extend from the base conductor 570 to engage the edges of the adjacent connecting beams 572, 574 of the ground contact 394c. The connecting beams 586, 588 of the ground contact 394d engage the connecting tabs 576, 578 of the adjacent ground contact 394c. Other arrangements of the ground contacts 394 are possible in alternative embodiments to provide electrical shielding for the signal contacts 392.

FIGS. 30-32 illustrate a mating sequence of the contacts 228, 328 of the first circuit card assembly 120 and the second circuit card assembly 122. FIG. 30 shows a portion of the second circuit card assembly 122 poised for mating with the first circuit card assembly 120 prior to the first electrical connector 202 moving in the connector mating direction 132. FIG. 31 shows a portion of the second circuit card assembly 122 partially mated with the first circuit card assembly 120. FIG. 32 shows the second circuit card assembly 122 fully mated with the first circuit card assembly 120. While the mating sequence is described as the first circuit card assembly 120 being fixed and the second circuit card assembly 122 being moved into position relative to the first circuit card assembly 120, it should be realized that in alternative embodiments, the second circuit card assembly 122 may be fixed and the first circuit card assembly 120 may be moved into position relative to the second circuit card assembly 122.

During mating, the second circuit card assembly 122 is aligned with the first circuit card assembly 120 (for example, with the first slot 204). The second PCB 200 is slid or loaded in the board loading direction 130 parallel to the first slot 204. When mated, the first PCB 200 is oriented perpendicular to the second PCB 300 (see FIG. 2) and both PCBs 200, 300 are aligned in the board loading direction 130. As such, air is able to flow past the circuit card assemblies 120, 122 with minimal interference from either PCB 200, 300. The electrical connectors 202, 302 are elongated to reduce the cross-sectional area of the electrical connectors 202, 302 to reduce blocking of the airflow. The first and second mating ends 234, 334 of the first and second electrical connectors 202, 302 are oriented parallel to the board loading direction 130.

As the second electrical connector 202 is moved forward in the board loading direction 130 relative to the first electrical connector 202, the second contacts 328 are also moved forward in the board loading direction 130. At some point during the loading, the first electrical connector 202 is moved toward the second electrical connector 302 in the connector mating direction 132. For example, when the actuators 357 (FIG. 19) engage the cam levers 258, the mating housing 240 is driven sideways in the connector mating direction 132 relative to the second electrical connector 302. The first contacts 228 are also moved sideways in the connector mating direction 132 relative to the second contacts 328 with the mating housing 240. As such, during mating, the first contacts 228 are moving sideways in the connector mating direction 132 and the second contacts 328 are moving forward in the board loading direction 130 simultaneously. The relative, compound movement of the first and second contacts 228, 328 cause mating of the contacts 228, 328 in the contact mating direction 134, which is non-parallel to the board loading direction 130 and non-parallel to the connector mating direction 132. The contacts 228, 328 are mated at an angle. During mating, the leading edges 263 of the contacts 228 are passing the leading ends 363 of the contacts 328 and moving toward the trailing ends 365 of the contacts 328 and the tips 269 of the contacts 228 are passing the tips 369 of the contacts 328 and moving toward the bases 370 of the contacts 328.

FIG. 33 is an end view of the first circuit card assembly 120 and the second circuit card assembly 122 during mating prior to the first electrical connector 302 moving in the connector mating direction 132. FIG. 34 is an end view of the first circuit card assembly 120 and the second circuit card assembly 122 in a mated position. The second contacts 328 are aligned with the slots 402 as the second circuit card assembly 122 is loaded in the board loading direction 130. During mating, the first electrical connector 202 is moved in the connector mating direction to mate the first contacts 228 with the second contacts 328.

Figure 35:
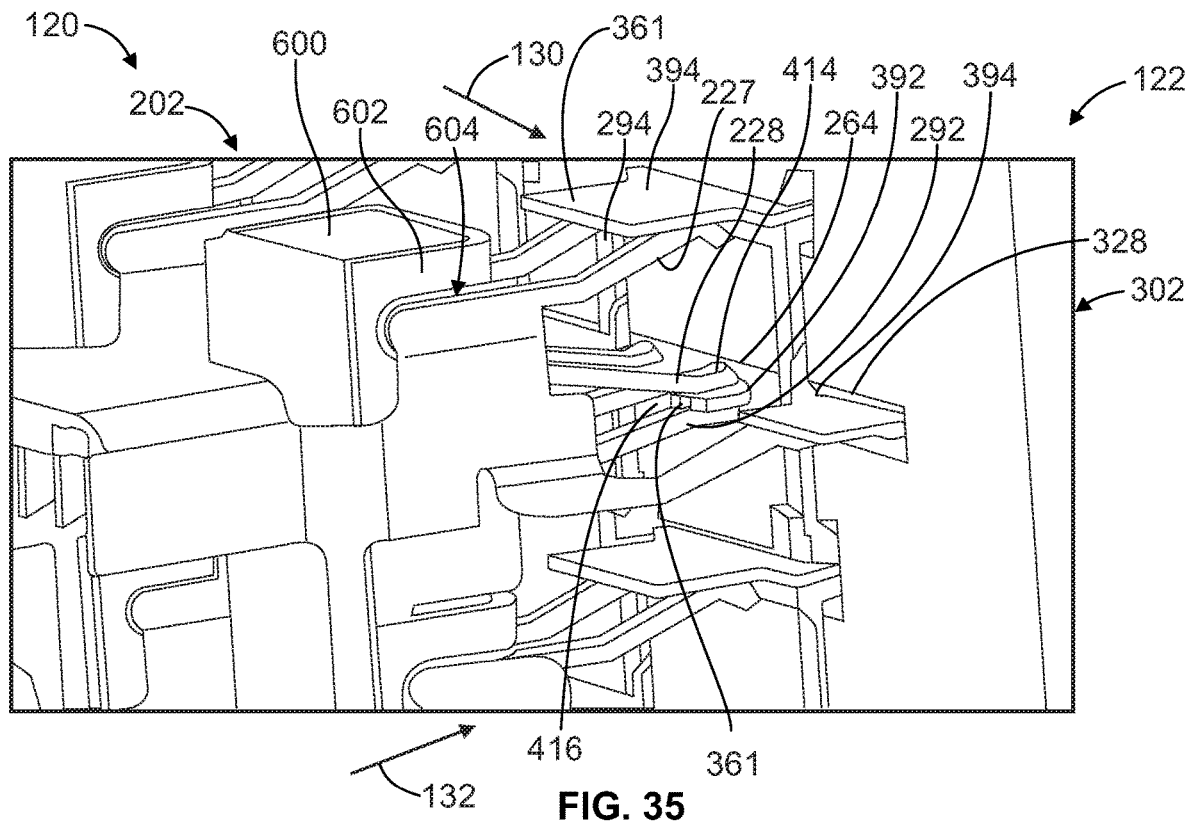
FIG. 35 is a partial sectional view of a portion of the first circuit card assembly and the second circuit card assembly.
Figure 36:
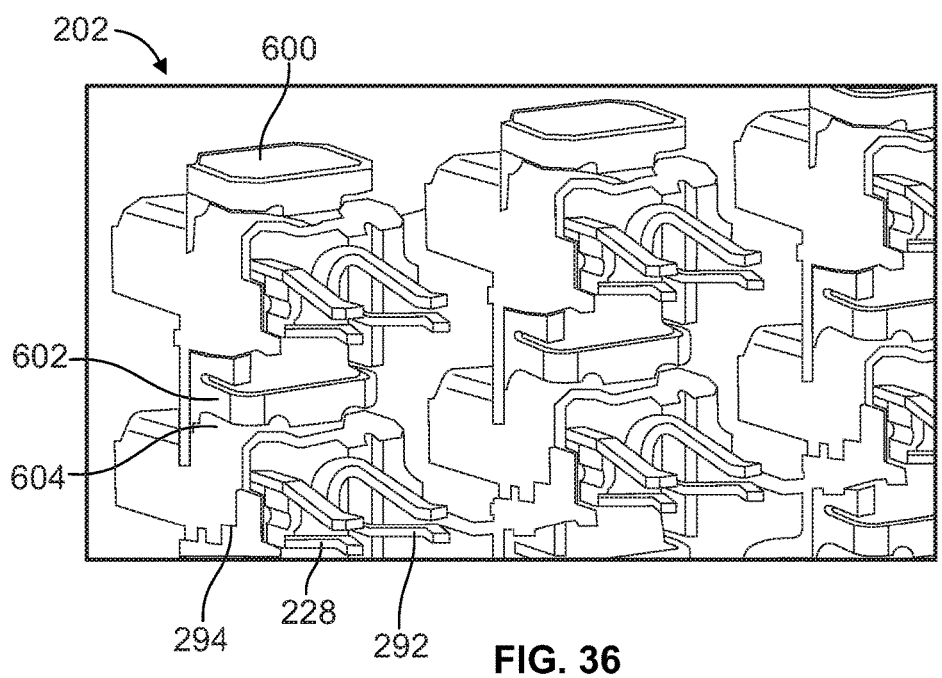
FIG. 36 is a perspective view of a portion of the first electrical connector.

FIG. 35 is a partial sectional view of a portion of the first circuit card assembly 120 and the second circuit card assembly 122 showing the first and second contacts 228, 328 mated. FIG. 36 is a perspective view of a portion of the first electrical connector 202 showing the signal contacts 292 and the ground contacts 294. The mating beams 361 of the signal contacts 392 of the second electrical connector 302 are received in the sockets 416 of the mating beams 414 of the signal contacts 292 of the first electrical connector 202. The mating beams 361 are mated with the mating beams 414 at an angled contact mating direction 134 due to the mating beams 361 moving in the board loading direction 130 while the mating beams 414 are moving in the connector mating direction 132. The ground contacts 294 are electrically connected to corresponding ground contacts 394.

In an exemplary embodiment, the first electrical connector 202 includes dielectric frames 600 holding the mating ends 264 of the contacts 228 and ground clips 602 coupled to the dielectric frames 600 to electrically connect corresponding ground contacts 294. The ground clips 602 includes slots 604 receiving portions of the ground contacts 294. The ground clips 602 mechanically and electrically engage the ground contacts 294 to electrically common the ground contacts 294, such as vertically.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
a first circuit card assembly having a first printed circuit board (PCB) and a first electrical connector having a first mating end and first contacts at the first mating end; and
a second circuit card assembly having a second PCB and a second electrical connector having a second mating end and second contacts at the second mating end, wherein at least one of the first PCB and the second PCB include a slot configured to receive the other of the first PCB and the second PCB;
wherein the first PCB and the second PCB are mated in a board mating direction to bring the first mating end and the second mating end into alignment;
wherein the first mating end of the first electrical connector is mated to the second mating end of the second electrical connector in a connector mating direction perpendicular to the board mating direction; and
wherein the first contacts engage with and wipe along the second contacts in a contact mating direction during mating of the first and second contacts, the first and second contacts being mated as the first PCB and the second PCB are moved in the board mating direction and as the first electrical connector and the second electrical connector are moved in the connector mating direction, the contact mating direction being non-parallel to the board mating direction and non-parallel to the connector mating direction.

2. The communication system of claim 1, wherein the second contacts include signal contacts and ground contacts, each signal contact has a mating beam extending along a beam axis, wherein the beam axis is non-parallel to the contact mating direction, each ground contact has a first wall extending along a first side of the corresponding signal contact and a second wall extending along a second side of the corresponding signal contact to provide electrical shielding on at least two different sides of the corresponding signal contact.

3. The communication system of claim 1, wherein the second contacts include signal contacts and ground contacts providing electrical shielding for corresponding signal contacts, each ground contact being electrically commoned with at least one other ground contact.

4. The communication system of claim 1, wherein the second contacts include signal contacts and ground contacts, the signal contacts being arranged in pairs, the ground contacts providing circumferential shielding on at least four sides of each of the pairs of signal contacts.

5. The communication system of claim 1, wherein the first contacts include signal contacts and ground contacts providing electrical shielding on at least two different sides of the corresponding signal contacts.

6. The communication system of claim 1, wherein the first contacts include signal contacts and ground contacts providing electrical shielding for the signal contacts, each signal contact having a base conductor, a dielectric shroud around the base conductor and a mating beam extending from the base conductor out of the dielectric shroud to the mating end for mating with the corresponding second contact, each ground contact having a first wall seated against the corresponding dielectric shroud and extending along a first side of the corresponding signal contact and a second wall seated against the corresponding dielectric shroud and extending along a second side of the corresponding signal contact, each ground contact having a first mating beam aligned with the mating beam of the corresponding signal contact and extending along the first side of the corresponding signal contact, and each ground contact having a second mating beam aligned with the mating beam of the corresponding signal contact and extending along the second side of the corresponding signal contact.

7. The communication system of claim 6, wherein the first mating beam is positioned further from the corresponding signal contact than the first wall and wherein the second mating beam is positioned further from the corresponding signal contact than the second wall.

8. The communication system of claim 1, wherein the first PCB includes a first mating edge, the first mating end of the first electrical connector being oriented perpendicular to the first mating edge of the first PCB, and the second PCB includes a second mating edge, the second mating end of the second electrical connector being oriented perpendicular to the second mating edge of the second PCB.

9. The communication system of claim 1, wherein the first and second PCBs move relative to each other along a board mating axis while the first and second electrical connectors move relative to each other along a connector mating axis perpendicular to the board mating axis.

10. The communication system of claim 1, wherein the first contact includes a first side extending between a leading edge and a trailing edge and including a first mating interface, and wherein the second contact includes a mating beam having a side face including a second mating interface, the side face extending between a leading end and a trailing end of the mating beam, the leading edge moving past the leading end as the first and second contacts are moved in the contact mating direction to mate the first and second mating interfaces.

11. The communication system of claim 10, wherein the first contact extends between a base and a tip and wherein the second contact extends between a base and a tip, the tip of the first contact moving toward the base of the second contact as the first and second contacts are moved in the contact mating direction to mate the first and second mating interfaces.

12. The communication system of claim 1, wherein the second electrical connector includes a housing mounted to the second PCB, the housing having contact channels receiving corresponding second contacts through the second mating end of the housing to engage and electrically connect to the second PCB at a mounting end of the housing opposite the second mating end.

13. The communication system of claim 1, wherein the first electrical connector includes a housing at the first mating end having contact channels receiving corresponding first contacts, the housing having slots at the first mating end aligned with corresponding contact channels, the slots receiving the second contacts during mating of the first and second circuit card assemblies such that the second contacts move in the slots relative to the first contacts during mating of the first and second circuit card assemblies.

14. The communication system of claim 1, wherein either the first PCB or the second PCB is oriented horizontally and the other of the first PCB or the second PCB is oriented vertically.

15. The communication system of claim 1, wherein the first mating end is oriented perpendicular to the first PCB, and wherein the second mating end is oriented parallel to the second PCB.

16. A circuit card assembly for a communication system comprising:
a printed circuit board (PCB) having a first surface and a second surface extending along a primary axis and a secondary axis, the PCB having a mating edge between the first and second surfaces generally parallel to the secondary axis, the PCB having a mounting area on the first surface adjacent the mating edge; and
an electrical connector mounted to the first surface at the mounting area, the electrical connector having a housing extending between a front and a rear, the front being provided proximate to the mating edge, the electrical connector having a mounting end extending between the front and the rear being mounted to the mounting area, the electrical connector having a mating end extending between the front and the rear generally parallel to the primary axis, the mating end being configured to be mated to a mating electrical connector, the electrical connector having signal contacts held by the housing being terminated to the PCB and ground contacts held by the housing being terminated to the PCB, each signal contact has a mating beam extending along a beam axis, wherein each signal contact is configured to be mated with a mating contact in a contact mating direction non-parallel to the beam axis, each ground contact having a first wall extending along a first side of the corresponding signal contact and a second wall extending along a second side of the corresponding signal contact to provide electrical shielding on at least two different sides of the corresponding signal contact.

17. The circuit card assembly of claim 16, wherein the contact mating direction is at an angle of between 30° and 60° relative to the beam axis.

18. The circuit card assembly of claim 16, wherein each ground contact is electrically commoned with at least one other ground contact.

19. A circuit card assembly for a communication system comprising:
a printed circuit board (PCB) having a first surface and a second surface extending along a primary axis and a secondary axis, the PCB having a mating edge between the first and second surfaces generally parallel to the secondary axis, the PCB having a mounting area on the first surface adjacent the mating edge; and
an electrical connector mounted to the first surface at the mounting area, the electrical connector having a housing extending between a front and a rear, the front being provided proximate to the mating edge, the electrical connector having a mounting end extending between the front and the rear being mounted to the mounting area, the electrical connector having a mating end extending between the front and the rear generally parallel to the primary axis, the mating end being configured to be mated to a mating electrical connector in a connector mating direction generally parallel to the secondary axis, the electrical connector having signal contacts held by the housing and ground contacts held by the housing to provide electrical shielding on at least two different sides of the corresponding signal contacts, each signal contact having a base conductor, a dielectric shroud around the base conductor and a mating beam extending from the base conductor out of the dielectric shroud for mating with a mating contact in a contact mating direction non-parallel to a beam axis of the mating beam, each ground contact having a first wall seated against the corresponding dielectric shroud and extending along a first side of the corresponding signal contact and a second wall seated against the corresponding dielectric shroud and extending along a second side of the corresponding signal contact, each ground contact having a first mating beam aligned with the mating beam of the corresponding signal contact and extending along the first side of the corresponding signal contact, and each ground contact having a second mating beam aligned with the mating beam of the corresponding signal contact and extending along the second side of the corresponding signal contact.

20. The circuit card assembly of claim 19, wherein the first mating beam is positioned further from the corresponding signal contact than the first wall and wherein the second mating beam is positioned further from the corresponding signal contact than the second wall.

* * * * *